(12) United States Patent
Cheng et al.

(10) Patent No.: US 11,094,784 B2
(45) Date of Patent: Aug. 17, 2021

(54) GATE-ALL-AROUND FIELD EFFECT TRANSISTOR HAVING STACKED U SHAPED CHANNELS CONFIGURED TO IMPROVE THE EFFECTIVE WIDTH OF THE TRANSISTOR

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Julien Frougier, Albany, NY (US); Chanro Park, Clifton Park, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1 day.

(21) Appl. No.: 16/377,815

(22) Filed: Apr. 8, 2019

(65) Prior Publication Data
US 2020/0321434 A1    Oct. 8, 2020

(51) Int. Cl.
| | |
|---|---|
| *H01L 29/10* | (2006.01) |
| *H01L 29/06* | (2006.01) |
| *H01L 29/423* | (2006.01) |
| *H01L 29/78* | (2006.01) |
| *H01L 29/66* | (2006.01) |

(Continued)

(52) U.S. Cl.
CPC ...... *H01L 29/1037* (2013.01); *H01L 27/0886* (2013.01); *H01L 29/0673* (2013.01); *H01L 29/16* (2013.01); *H01L 29/42392* (2013.01); *H01L 29/6681* (2013.01); *H01L 29/66545* (2013.01); *H01L 29/785* (2013.01); *H01L 29/78696* (2013.01)

(58) Field of Classification Search
CPC .......... H01L 29/42392; H01L 29/1037; H01L 29/78696; H01L 29/66545; H01L 29/66798; H01L 29/66818; H01L 29/785–7856; H01L 29/0673; H01L 29/0676; H01L 29/06; H01L 29/067; H01L 29/08; H01L 29/0886; H01L 29/10; H01L 29/16; H01L 29/66; H01L 29/6681; H01L 29/78; H01L 29/088; H01L 29/103; H01L 29/665; H01L 29/6654; H01L 29/668; H01L 27/0886
USPC ........................................................ 257/288
See application file for complete search history.

(56) References Cited

U.S. PATENT DOCUMENTS

| | | |
|---|---|---|
| 8,581,349 B1 | 11/2013 | Sekar |
| 8,912,593 B2 | 12/2014 | Matsuda |

(Continued)

*Primary Examiner* — Kenneth Parker
*Assistant Examiner* — John Lin
(74) *Attorney, Agent, or Firm* — Cantor Colburn LLP; Joseph Petrokaitis

(57) ABSTRACT

A method of fabricating a semiconductor device is described. The method includes forming a stack of sacrificial layers on a substrate. A U-shaped trench is formed in the stack of the sacrificial layers. A first U-shaped channel layer is deposited in the U-shaped trench. A first U-shaped sacrificial layer is conformally formed covering the U-shaped channel layer. A second U-shaped channel layer is conformally deposited covering the first U-shaped sacrificial layer. A gate is formed around the first and the second U-shaped channel layers.

13 Claims, 20 Drawing Sheets

(51) Int. Cl.
*H01L 27/088* (2006.01)
*H01L 29/16* (2006.01)
*H01L 29/786* (2006.01)

(56) References Cited

U.S. PATENT DOCUMENTS

| | | |
|---|---|---|
| 9,224,837 B2 | 12/2015 | Anderson et al. |
| 9,391,176 B2 | 7/2016 | Flachowsky |
| 9,412,752 B1 | 8/2016 | Yeh et al. |
| 9,524,980 B2 | 12/2016 | Lue |
| 10,008,512 B2 | 6/2018 | Kwak |
| 2005/0145941 A1* | 7/2005 | Bedell ............... H01L 29/66795 257/348 |
| 2007/0009840 A1* | 1/2007 | Kim .................... H01L 21/3086 430/313 |
| 2012/0001171 A1 | 1/2012 | Atanackovic |
| 2013/0228833 A1 | 9/2013 | Xiao |
| 2015/0295094 A1 | 10/2015 | Obradovic |
| 2016/0071869 A1 | 3/2016 | Lee |
| 2018/0069016 A1 | 3/2018 | Barbato |
| 2019/0164765 A1* | 5/2019 | Yeoh ................. H01L 21/76816 |

* cited by examiner

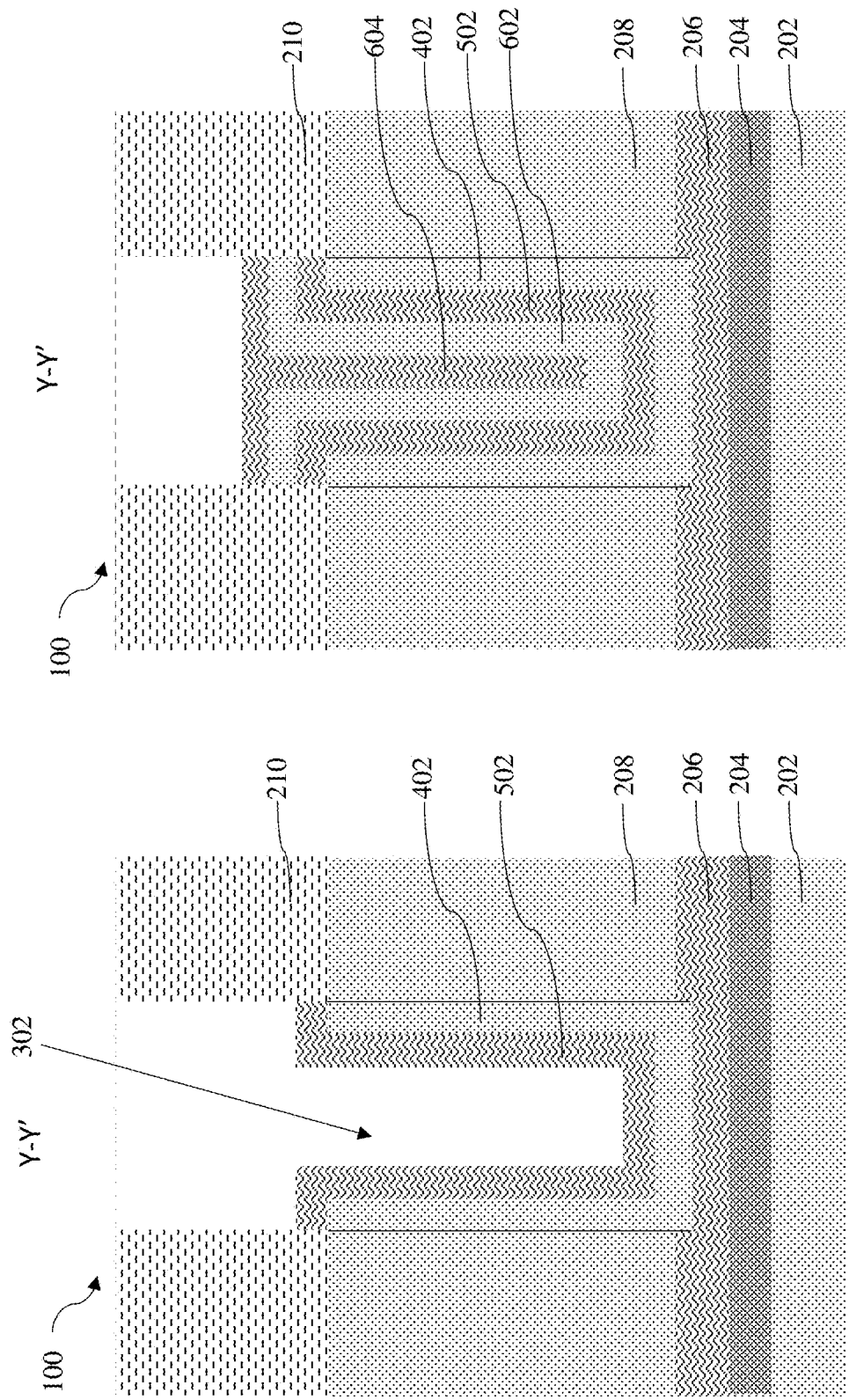

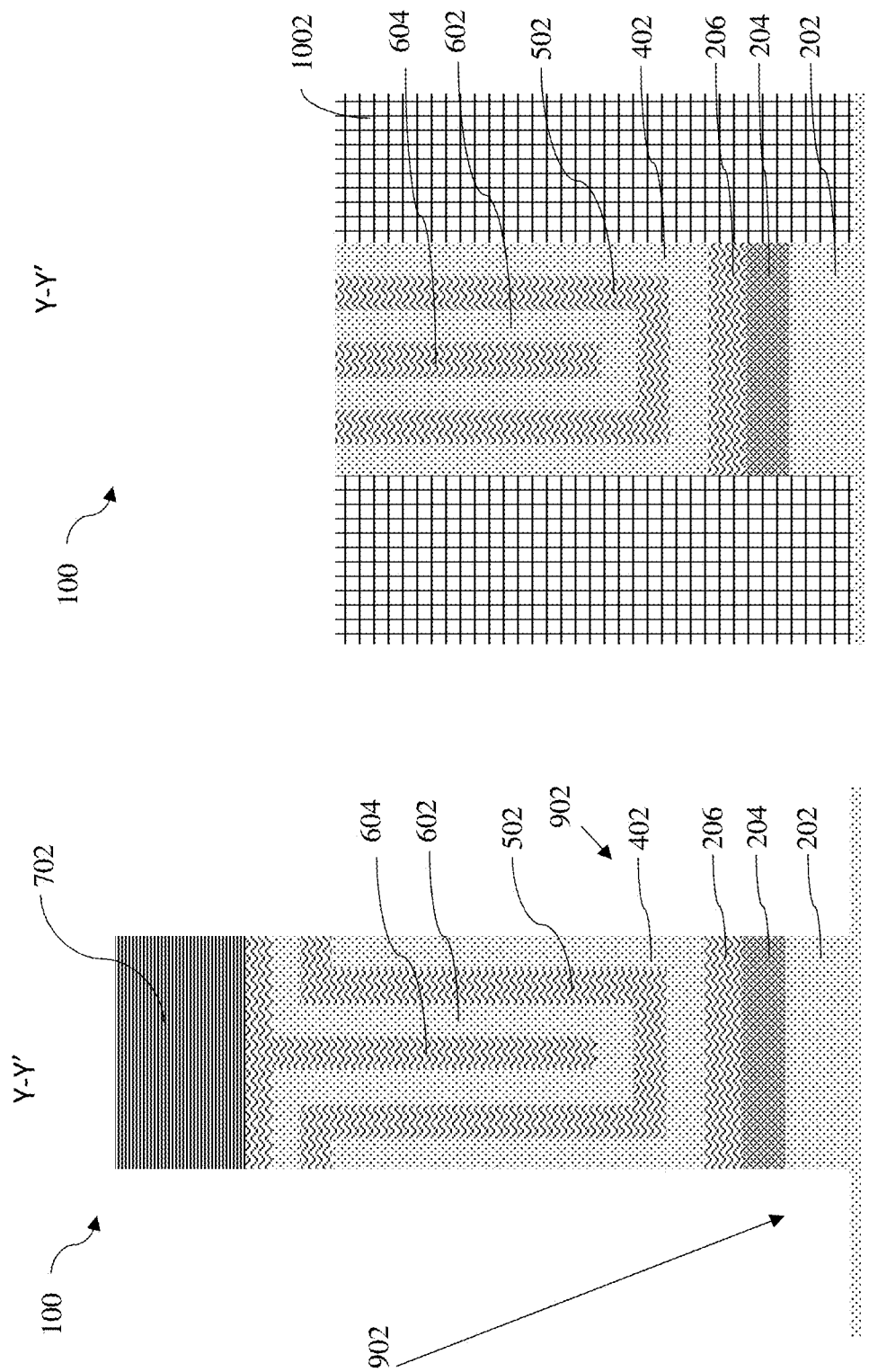

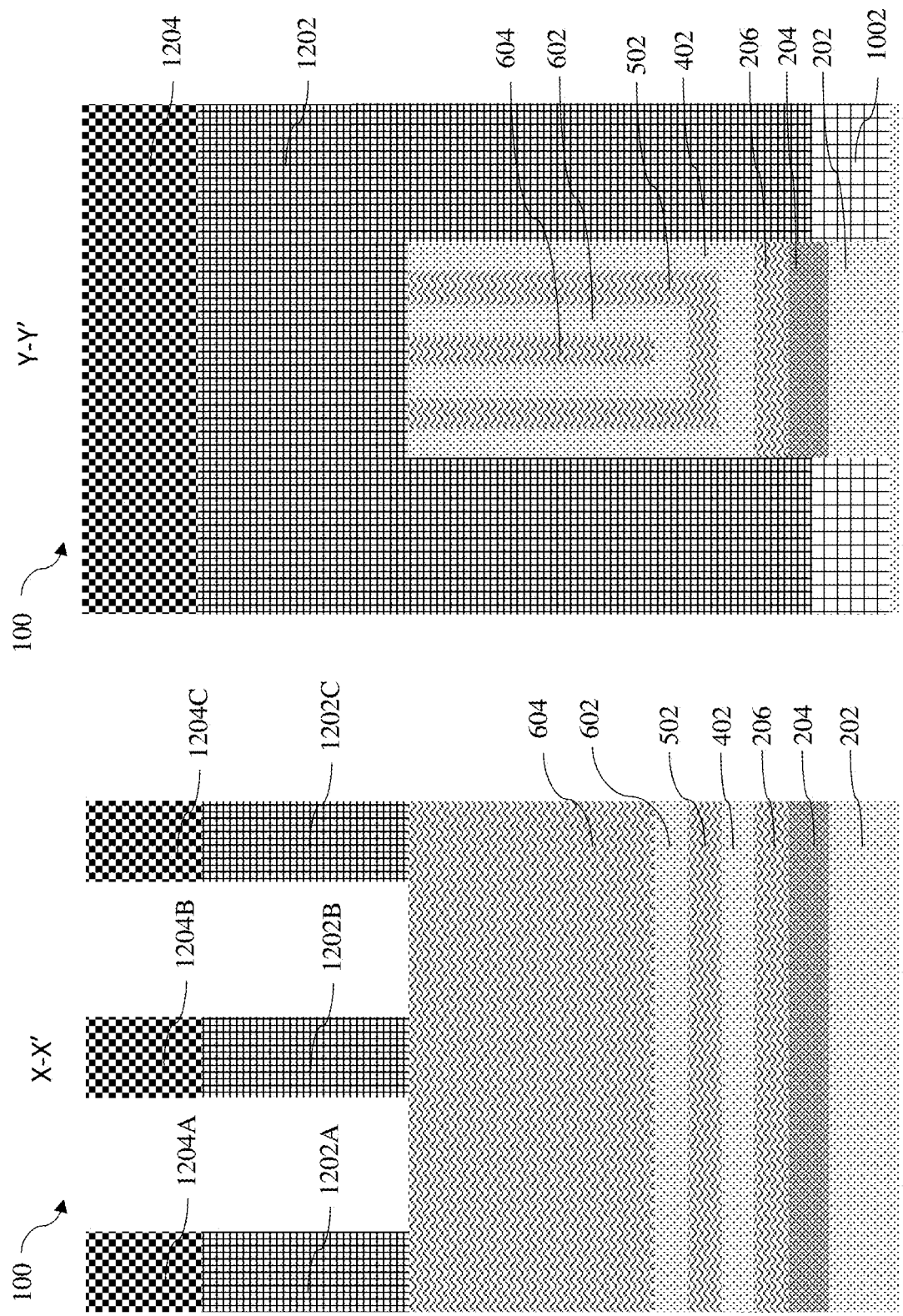

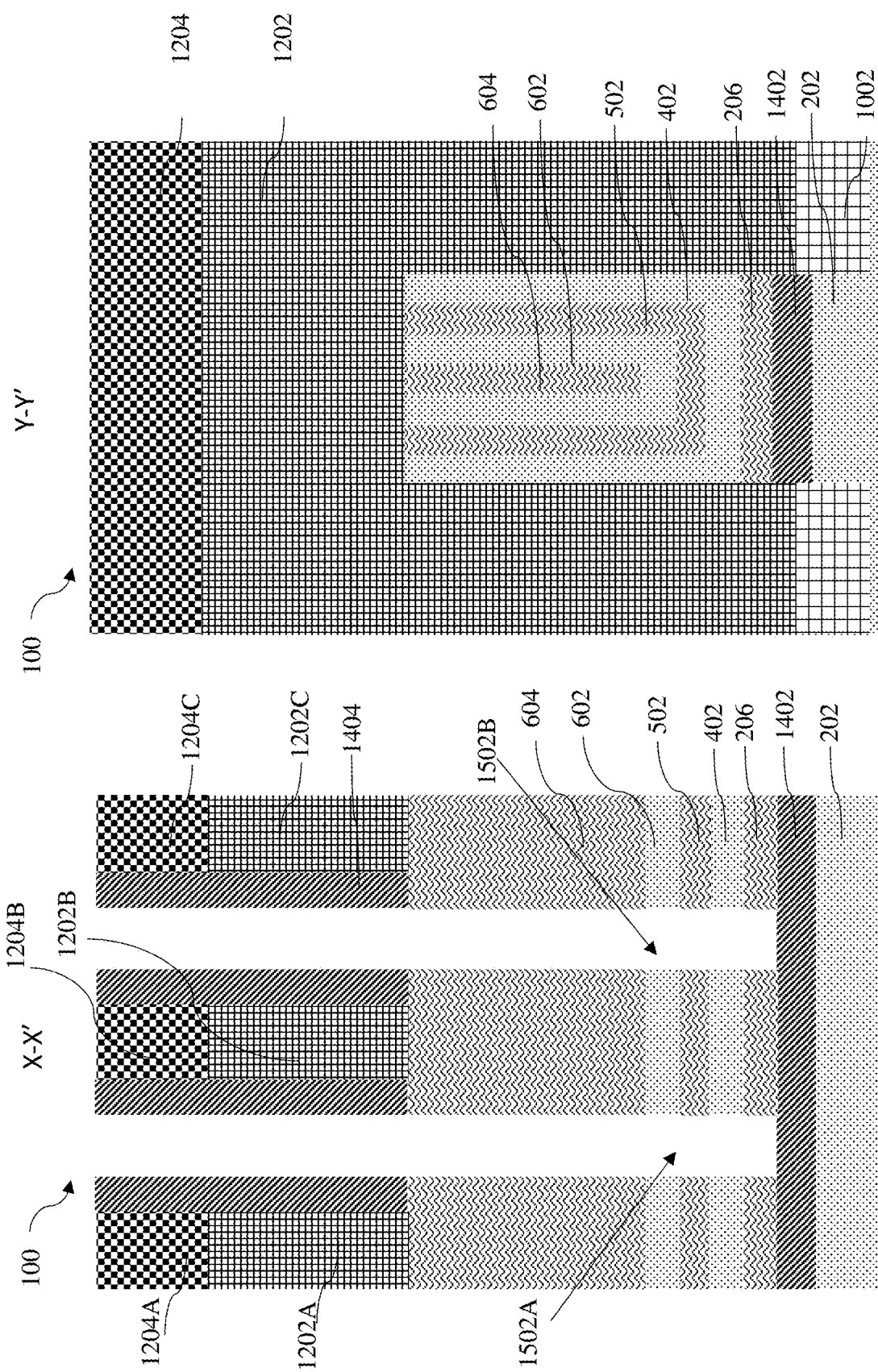

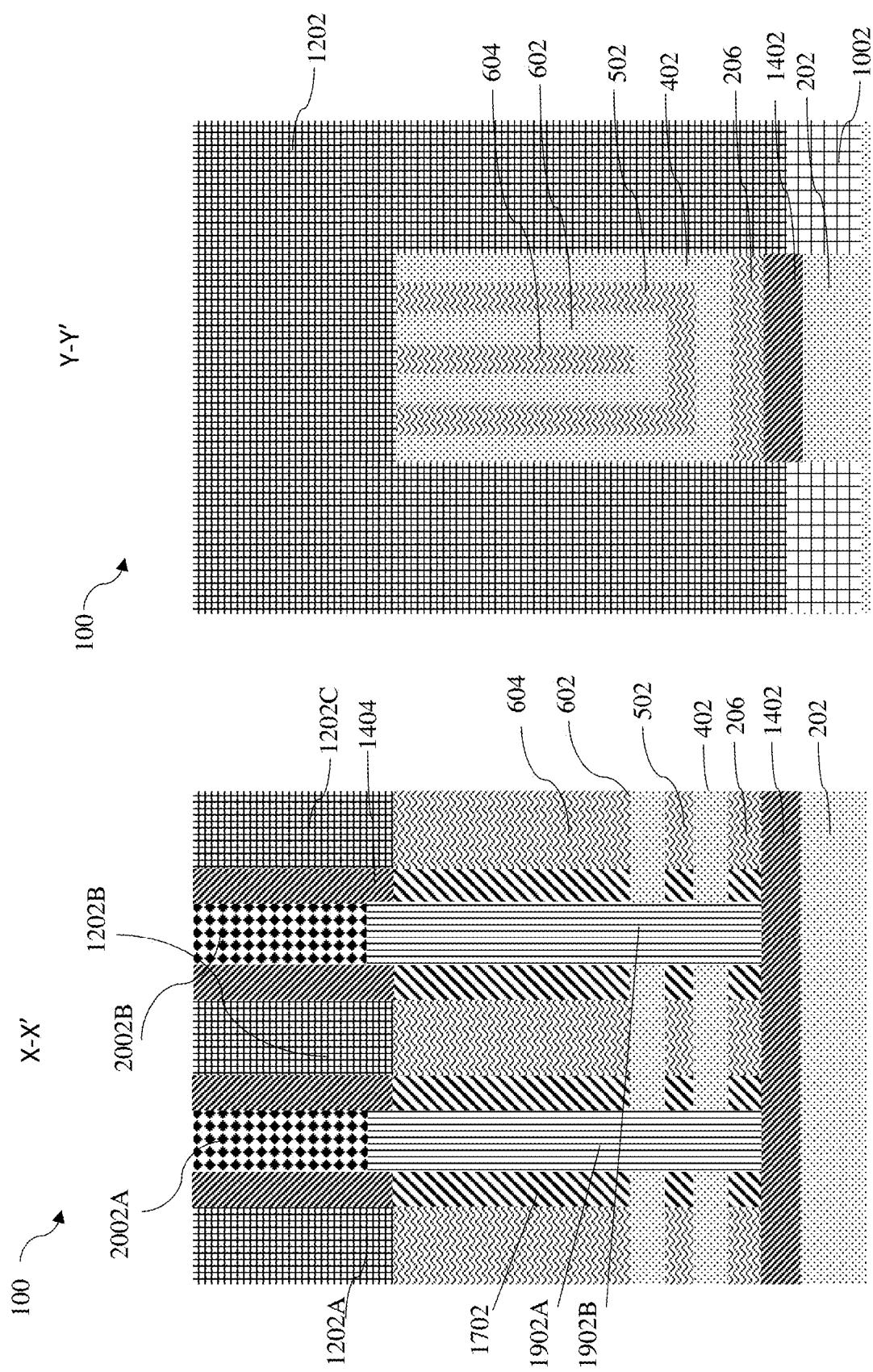

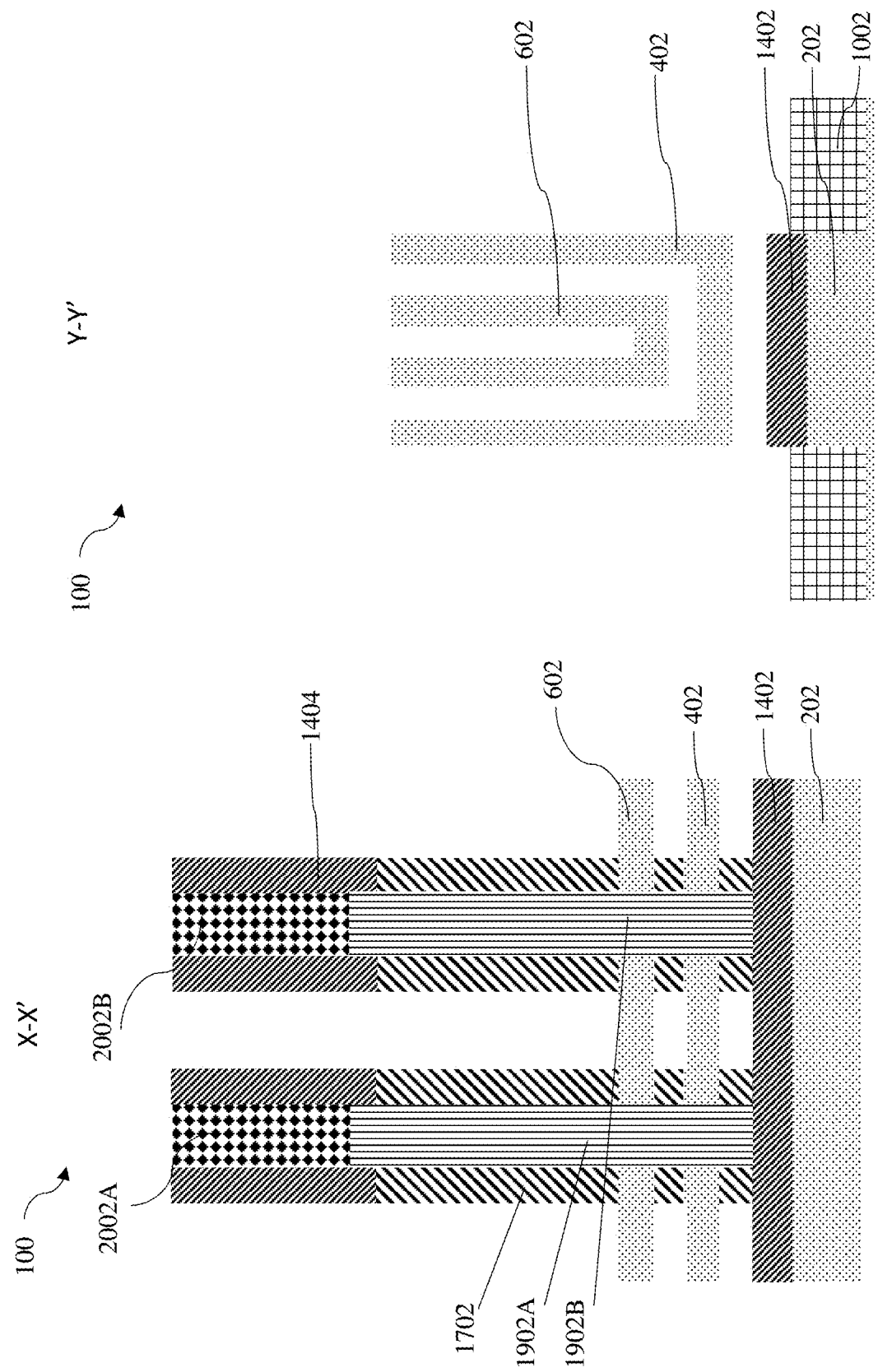

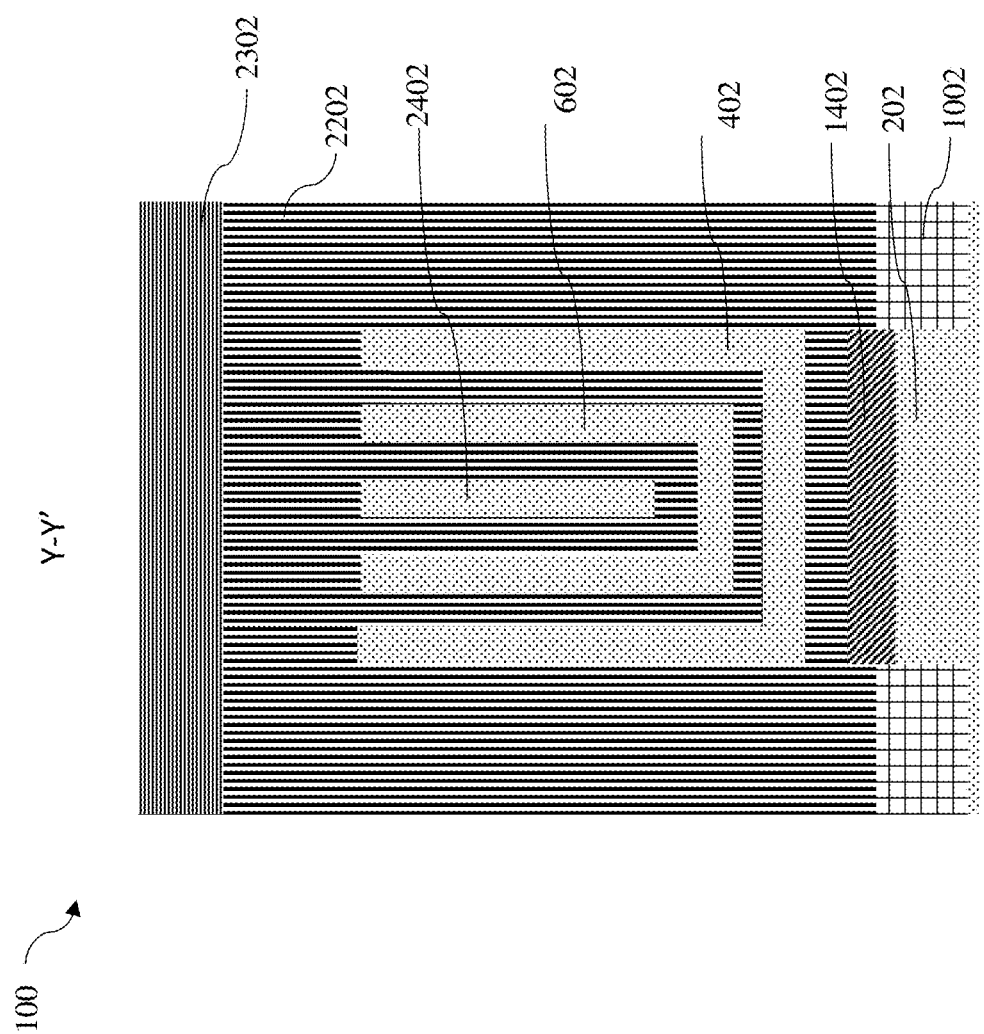

```
                    2502
                    ┌─────────────────────────────────────────────────────────────────┐
                    │           FORM AN EPITAXIAL STACK OF SACRIFICIAL LAYERS         │
                    └─────────────────────────────────────────────────────────────────┘
     2504                                    ▽
                    ┌─────────────────────────────────────────────────────────────────┐
                    │              PATTERN A TRENCH INTO THE EPITAXIAL STACK          │
                    └─────────────────────────────────────────────────────────────────┘
     2506                                    ▽
                    ┌─────────────────────────────────────────────────────────────────┐
                    │         DEPOSIT A FIRST U-SHAPPED CHANNEL LAYER IN THE TRENCH   │
                    └─────────────────────────────────────────────────────────────────┘
     2508                                    ▽
                    ┌─────────────────────────────────────────────────────────────────┐
                    │   FORM A SACRIFICIAL LAYER CONFORMALLY COVERING THE FIRST U-SHAPED CHANNEL LAYER │
                    └─────────────────────────────────────────────────────────────────┘
     2510                                    ▽
                    ┌─────────────────────────────────────────────────────────────────┐
                    │       DEPOSIT A SECOND U-SHAPPED CHANNEL LAYER IN THE TRENCH    │
                    └─────────────────────────────────────────────────────────────────┘
     2512                                    ▽
                    ┌─────────────────────────────────────────────────────────────────┐
                    │  FORM A SACRIFICIAL LAYER CONFORMALLY COVERING THE SECOND U-SHAPED CHANNEL LAYER │
                    └─────────────────────────────────────────────────────────────────┘
     2514                                    ▽
                    ┌─────────────────────────────────────────────────────────────────┐
                    │    FORM SHALLOW TRENCH ISOLATION (STI), FILL STI OXIDE, AND RECESS THE STI OXIDE │
                    └─────────────────────────────────────────────────────────────────┘
     2516                                    ▽
                    ┌─────────────────────────────────────────────────────────────────┐
                    │       FORM DUMMY GATES, BOTTOM ISOLATION LAYER, AND INNER SPACERS │
                    └─────────────────────────────────────────────────────────────────┘
     2518                                    ▽
                    ┌─────────────────────────────────────────────────────────────────┐
                    │          FORM SOURCE/DRAIN, DEPOSIT ILD, AND PERFORM CMP        │
                    └─────────────────────────────────────────────────────────────────┘
     2520                                    ▽
                    ┌─────────────────────────────────────────────────────────────────┐
                    │      REMOVE DUMMY GATE AND FORM REPLACEMENT METAL GATE (RMG)    │
                    └─────────────────────────────────────────────────────────────────┘
     2522                                    ▽
                    ┌─────────────────────────────────────────────────────────────────┐
                    │              FORM SAC CAP, AND FORM TS CONTACTS                 │
                    └─────────────────────────────────────────────────────────────────┘
```

FIG. 25

GATE-ALL-AROUND FIELD EFFECT TRANSISTOR HAVING STACKED U SHAPED CHANNELS CONFIGURED TO IMPROVE THE EFFECTIVE WIDTH OF THE TRANSISTOR

BACKGROUND

The present invention generally relates to fabrication methods and resulting structures for semiconductor devices. More specifically, the present invention relates to Gate-All-Around (GAA) Field Effect Transistors (FET) having stacked U-shaped channels configured to improve the effective width ($M_{eff}$) of the GAA FET.

The metal oxide semiconductor field effect transistor (MOSFET) is a type of field effect transistor (FET) that can be used for switching electronic signals. The MOSFET has a source, a drain, and a metal oxide gate electrode. A channel region communicatively couples the source to the drain. The metal gate is electrically insulated from the channel region by a thin layer of insulating material, for example, silicon dioxide or high dielectric constant (high-k) dielectrics, which makes the input resistance of the MOSFET relatively high. The gate voltage controls whether or not the channel region conducts, thereby determining whether or not the path from the source through the channel region to drain is an open circuit ("off") or a resistive path ("on").

The wafer footprint of an FET is related to the electrical conductivity of the channel material. If the channel has a relatively high conductivity, either by having a channel material with higher mobility or by having more conducting surfaces per footprint, the FET can be made with a correspondingly smaller wafer footprint. The GAA nanosheet FET is a known architecture for providing a relatively small FET footprint by forming the channel region as a series of nanosheets. In a GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

SUMMARY

Embodiments of the present invention are directed to a method for fabricating a semiconductor device, such as, nanosheet MOSFETs with concentrically stacked U-shaped channel layers. The method includes forming a stack of sacrificial layers on a substrate, forming a U-shaped trench in the stack of the sacrificial layers, depositing a first U-shaped channel layer in the U-shaped trench, forming a first U-shaped sacrificial layer conformally covering the U-shaped channel layer, depositing a second U-shaped channel layer conformally covering the first U-shaped sacrificial layer, and forming a gate around the first and the second U-shaped channel layers.

Embodiments of the present invention are directed to a semiconductor device, such as, nanosheet MOSFETs with concentrically stacked U-shaped channel layers. The semiconductor device includes a semiconductor substrate, at least one U-shaped channel layer, source and drain regions formed on the substrate, and a gate around the at least one U-shaped channel layer.

Embodiments of the present invention are directed to a semiconductor device. The semiconductor device includes a semiconductor substrate, a stack including at least two concentrically stacked U-shaped channel layers, source and drain regions formed on the substrate, and a gate around the at least one U-shaped channel layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 depicts a cross-sectional side-view of the semiconductor device taken along line Y-Y' (shown in FIG. 1) after a fabrication stage according to embodiments of the invention;

FIG. 6 depicts a cross-sectional side-view of the semiconductor device taken along line Y-Y' (shown in FIG. 1) after a fabrication stage according to embodiments of the invention;

FIG. 9 depicts a cross-sectional side-view of the semiconductor device taken along line Y-Y' (shown in FIG. 1) after a fabrication stage according to embodiments of the invention;

FIG. 10 depicts a cross-sectional side-view of the semiconductor device taken along line Y-Y' (shown in FIG. 1) after a fabrication stage according to embodiments of the invention;

FIG. 12A depicts a cross-sectional side-view of the semiconductor device taken along line X-X' (shown in FIG. 1) after a fabrication stage according to embodiments of the invention;

FIG. 12B depicts a cross-sectional side-view of the semiconductor device taken along line Y-Y' (shown in FIG. 1) after a fabrication stage according to embodiments of the invention;

FIG. 15A depicts a cross-sectional side-view of the semiconductor device taken along line X-X' (shown in FIG. 1) after a fabrication stage according to embodiments of the invention;

FIG. 15B depicts a cross-sectional side-view of the semiconductor device taken along line Y-Y' (shown in FIG. 1) after a fabrication stage according to embodiments of the invention;

FIG. 20A depicts a cross-sectional side-view of the semiconductor device taken along line X-X' (shown in FIG. 1) after a fabrication stage according to embodiments of the invention;

FIG. 20B depicts a cross-sectional side-view of the semiconductor device taken along line Y-Y' (shown in FIG. 1) after a fabrication stage according to embodiments of the invention;

FIG. 21A depicts a cross-sectional side-view of the semiconductor device taken along line X-X' (shown in FIG. 1) after a fabrication stage according to embodiments of the invention;

FIG. 21B depicts a cross-sectional side-view of the semiconductor device taken along line Y-Y' (shown in FIG. 1) after a fabrication stage according to embodiments of the invention;

FIG. 24 depicts a cross-sectional side-view of the semiconductor device taken along line Y-Y' (shown in FIG. 1) after a fabrication stage according to embodiments of the invention; and FIG. 25 depicts a flow diagram illustrating a method according to one or more embodiments of the invention.

Figure 1:
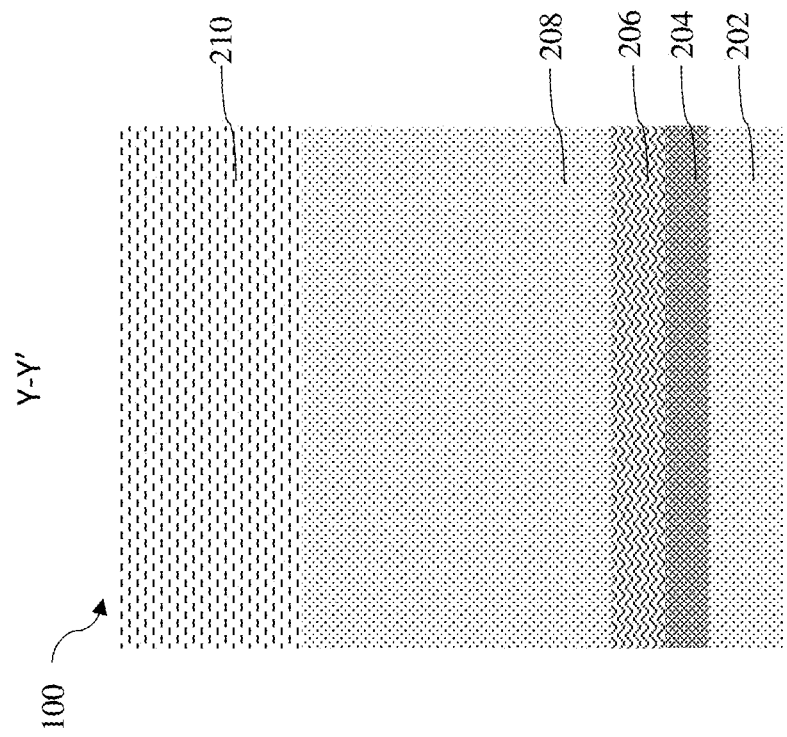
FIG. 1 depicts a simple diagram of a top view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is understood in advance that although this description includes a detailed description of an exemplary n-type and p-type gate-all-around (GAA) nanosheet FET architecture having silicon channel nanosheets and silicon germanium sacrificial nanosheets, implementation of the teachings recited herein are not limited to the particular FET architecture described herein. Rather, embodiments of the present invention are capable of being implemented in conjunction with any other type of FET device now known or later developed, including, for example, GAA nanosheet FET architectures having silicon germanium channel nanosheets and silicon sacrificial nanosheets or having channel nanosheets and sacrificial nanosheets formed from different III-V compound semiconductors.

Turning now to a description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and, under appropriate conditions, electrical current flows through the channel region from the source to the drain. The electrical current flow is induced in the channel region by a voltage applied at the gate electrode.

The wafer footprint of an FET is related to the electrical conductivity of the channel material. If the channel has a relatively high conductivity, either by having a channel material with higher mobility or by having more conducting surfaces per footprint, the FET can be made with a correspondingly smaller wafer footprint. The previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

As the size of semiconductor devices continue to shrink, it becomes challenging to provide sufficient effective device width per footprint of the device. Insufficient device width leads to unsatisfactory performance of the device. Therefore, there is need to improve effective width ($W_{eff}$) per footprint and to improve device performance at scaled CPP (contacted gate pitch).

Turning now to an overview of the aspects of the invention, one or more embodiments of the invention address the above-described shortcomings of the prior art by enhancing (increasing) the effective device width ($W_{eff}$) per footprint and by improving device performance at scaled CPP (contacted gate pitch). Accordingly, embodiments of the present invention provide fabrication methodologies and resulting devices for forming stacked channel transistors having enhanced effective device width. In one or more embodiments of the present invention, the effective device width is increased by providing a novel structure including concentrically stacked U-shaped silicon channels. The concentrically stacked U-shaped silicon channels provide substantially larger effective device width compared to traditional plate or sheet like silicon channels per unit footprint of the semiconductor device.

Turning now to a more detailed description of aspects of the present invention, FIGS. 1-20 are diagrams illustrating a semiconductor structure 100 after selected stages of a fin-first, wire-last replacement gate fabrication methodology for forming an exemplary GAA concentrically stacked U-shaped silicon channel MOSFET according to one or more embodiments of the present invention. As described in greater detail herein below, in accordance with one or more embodiments of the present invention, the silicon channels of the device are shaped like alphabet U and are concentrically stacked. In one or more embodiments of the invention, in addition to the concentrically stacked U-shaped silicon channels, the device further includes one or more non-U-shaped structures, for example, a bar or a sheet. It is readily apparent that the concentrically stacked U-shaped silicon channels would have larger contact surface area as compared to parallel-stacked rectangular sheets of the same width. Therefore, the concentrically stacked U-shaped silicon channels enhance the effective device width compared to traditional devices.

FIG. 1 depicts a simple diagram of a top view of a semiconductor device 100 according to embodiments of the invention. FIG. 1 is only for reference and illustrates a top-down view locations of the silicon channels and future gates. For simplicity and ease of understanding, FIG. 1 omits some layers (elements) so as to not obscure the figure.

Figure 2:
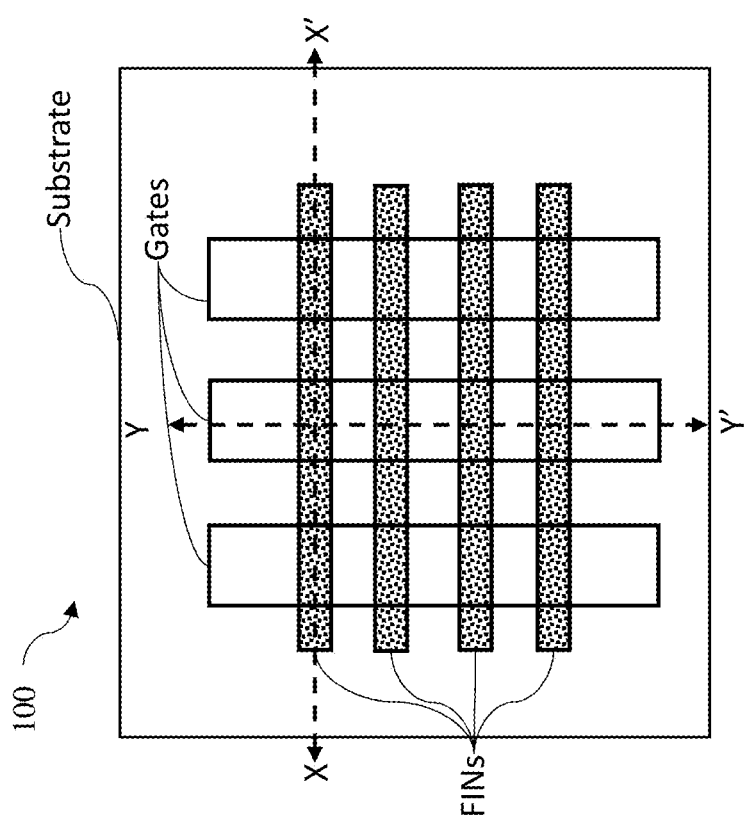
FIG. 2 depicts a cross-sectional side-view of the semiconductor device taken along line Y-Y' (shown in FIG. 1) after an initial set of fabrication operations according to embodiments of the invention.

FIG. 2 depicts a cross-sectional side-view of the semiconductor device 100 after initial fabrication operations in accordance with aspects of the invention. In embodiments of the invention, the semiconductor device 100 shown in FIG. 2 includes a substrate 202. In embodiments of the invention, the substrate 202 can be a silicon (Si) substrate, although other materials or substrates can be used. After initial fabrication processing, a sacrificial bottom isolation layer 204 is formed on top of the substrate 202. A sacrificial layer 206 is formed on top of the sacrificial bottom isolation layer 204. After forming the sacrificial layer 206, a region 208 of semiconductor material (e.g., Si) is formed on top of the sacrificial layer 206. The sacrificial bottom isolation layer 204, the sacrificial layer 206, and the region 208 can be epitaxially grown.

The sacrificial bottom isolation layer 204 is a material that can be removed (i.e., etched) without etching in the region 208. That is, the sacrificial bottom isolation layer 204 can be etched/removed without removing the sacrificial layer 206 and the region 208. The sacrificial bottom isolation layer 204 can be silicon germanium (SiGe). To cause the sacrificial bottom isolation layer 204 to be removed/etched without etching the other layers, the sacrificial bottom isolation layer 204 can be $SiGe_{y\ \%}$ where the atomic percent % for "y" ranges from 50-70% atomic percent. Particularly, y in $SiGe_{y\ \%}$ of sacrificial bottom isolation layer 204 can be about (or at least) 60% atomic percent such that the sacrificial bottom isolation layer 204 can be etched/removed without etching layers 206 and 208. In one or more embodiments, the sacrificial bottom isolation layer 204 includes $SiGe_{60\%}$.

The material of the sacrificial layer 206 can also include $SiGe_{x\ \%}$ where the atomic percent % for "x" ranges from about 15-35% atomic percent (i.e., x is less than y). In one or more embodiments, the sacrificial layer 206 includes $SiGe_{25\%}$. The material of the region 208 can include silicon (Si). A hardmask 210 is formed on top of the region 208. The hardmask 210 can be a nitride material, an oxide material, and/or a combination of oxide and nitride materials. In one or more embodiments of the invention, the hardmask 210 includes silicon nitride (SiN).

Figure 3:
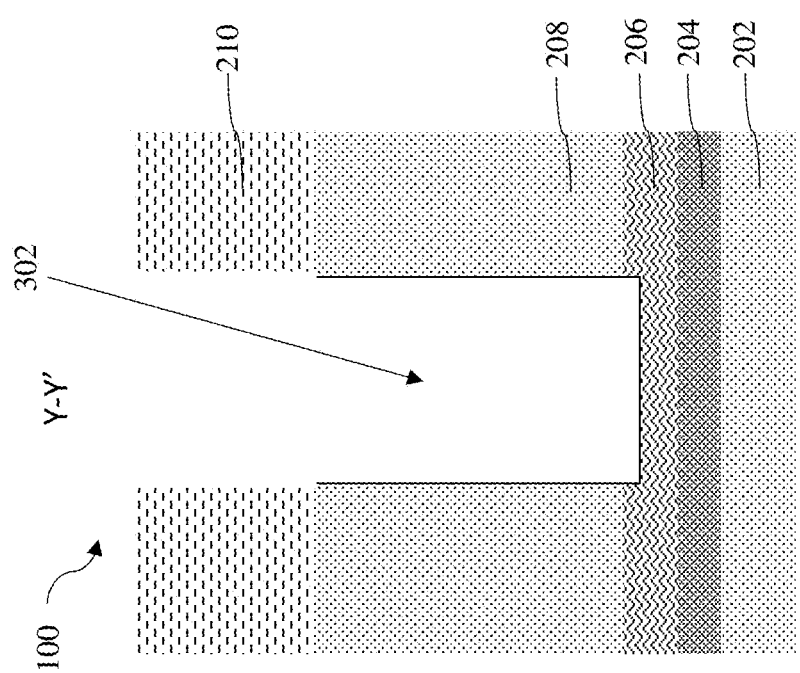
FIG. 3 depicts a cross-sectional side-view of the semiconductor device taken along line Y-Y' (shown in FIG. 1) after a fabrication stage according to embodiments of the invention.

FIG. 3 depicts a cross-sectional side view of the semiconductor device 100 after a next fabrication stage. As shown in FIG. 3, a trench 302 is patterned through the hardmask 210 and the region 208. The trench 302 extends up to the sacrificial layer 206. In one or more embodiments of the invention, reactive ion etching (ME) is used for forming the trench. In one or more embodiments of the invention, the trench does not stop at the border between the region 208 and the sacrificial layer 206; instead, there is some gouging (extension) of the trench into the sacrificial layer 206. The gouging can be seen in FIG. 3 as the trench 302 extends into the sacrificial layer 206.

Figure 4:
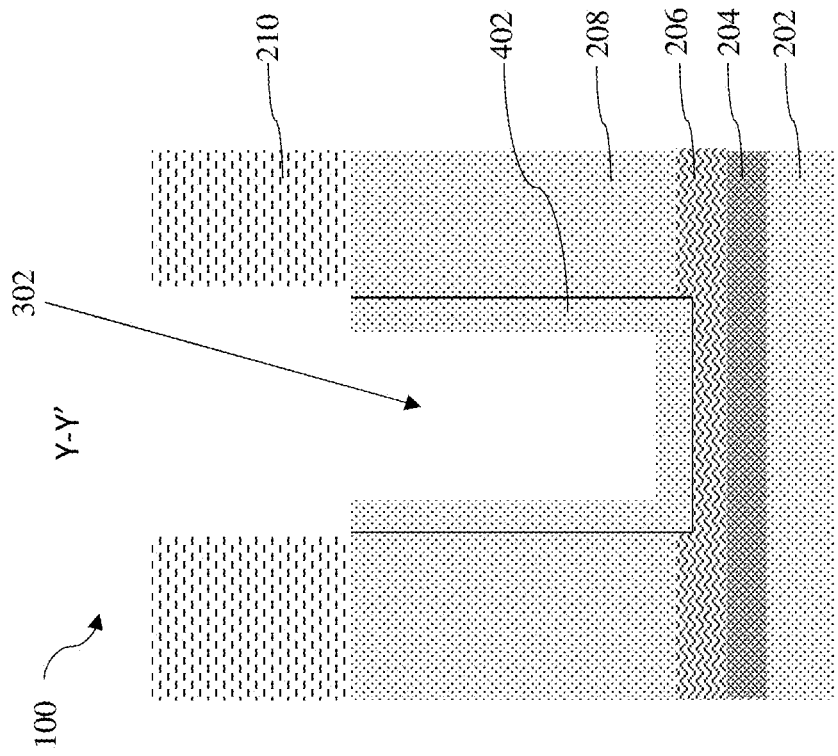
FIG. 4 depicts a cross-sectional side-view of the semiconductor device taken along line Y-Y' (shown in FIG. 1) after a fabrication stage according to embodiments of the invention.

FIG. 4 depicts a cross-sectional side view of the semiconductor device 100 after a next fabrication stage. As shown in FIG. 4, a U-shaped layer 402 of channel material is conformally deposited in the trench 302. The channel layer 402 can be formed using an epitaxial growth process. In one or more embodiments of the invention, the channel layer 402 includes silicon (Si). In one or more embodiments of the invention, the channel layer 402 is a nanosheet channel layer.

FIG. 5 depicts a cross-sectional side view of the semiconductor device 100 after a next fabrication stage. As shown in FIG. 5, a layer 502 of sacrificial material is conformally deposited over the channel layer 402. The sacrificial layer 502 can be formed using an epitaxial growth process. In one or more embodiments of the invention, the sacrificial layer 502 includes $SiGe_{25\%}$.

FIG. 6 depicts a cross-sectional side view of the semiconductor device 100 after a next fabrication stage. As shown in FIG. 6, a layer of channel material 602 is conformally deposited over the sacrificial layer 502. The channel layer 602 can be formed using an epitaxial growth process. In one or more embodiments of the invention, the channel layer 602 includes silicon (Si). In one or more embodiments of the invention, the channel layer 402 is a nanosheet channel layer. As further shown in FIG. 6, a layer of sacrificial material 604 is conformally deposited over the channel layer 602. The sacrificial layer 604 can be formed using an epitaxial growth process. In one or more embodiments of the invention, the sacrificial layer 604 includes $SiGe_{25\%}$.

FIG. 6 illustrates two U-shaped channel layers 402 and 602 which are concentrically stacked. However, embodiments of the invention are not limited to a stack of two U-shaped concentrically stacked channels. Instead, any number of concentrically stacked U-shaped channel layers can be used. In one or more embodiments of the invention, the semiconductor device 100 includes three layers of concentrically stacked U-shaped channel layers separated by sacrificial layers 602. In the structure of one or more embodiments of the invention, subsequent U-shaped channel layers are separated by at least one sacrificial layer between the subsequent U-shaped layers. In one or more embodiments of the invention, the semiconductor device includes two to ten layers of concentrically stacked U-shaped channel layers separated by one sacrificial layer between every two adjacent stacked U-shaped channel layers. In one or more embodiments of the invention, the semiconductor device includes, in addition to the concentrically stacked U-shaped channel layers, one or more substantially planar channel layer(s) 2402 (shown in FIG. 24). In one or more embodiments of the invention, the one or more substantially planar channel layer(s) 2402 can be located in the cavity defined by the U-shaped channel layer. In one or more embodiments of the invention, the term "substantially planar" refers to a structure wherein the main body of the structure is substantially planar with no bends or 90 degree angles.

Figure 7:
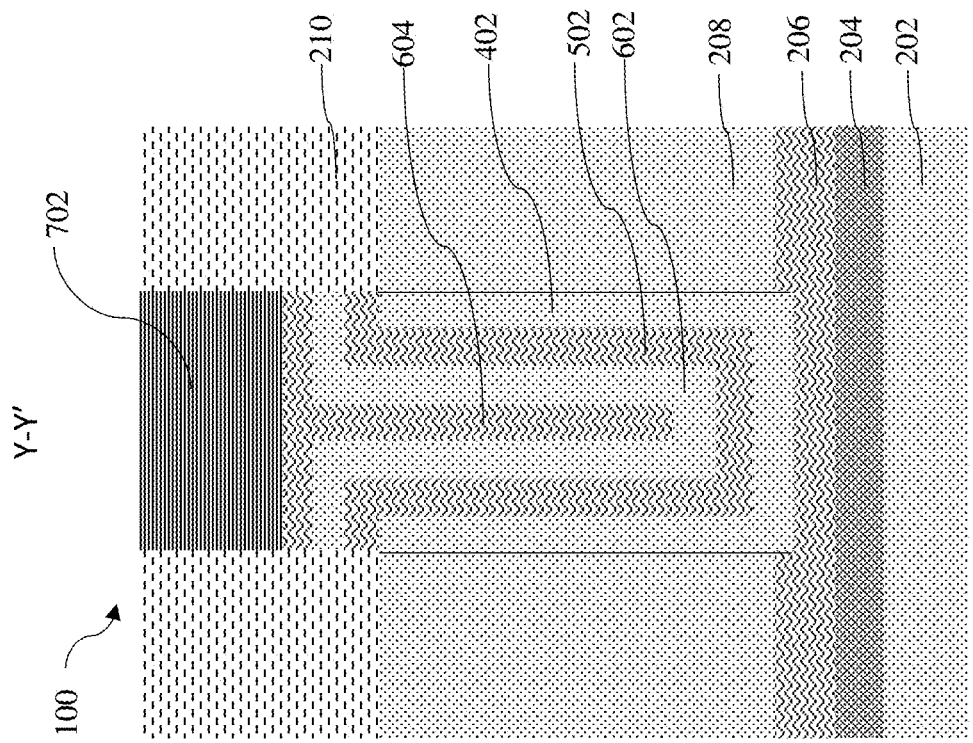
FIG. 7 depicts a cross-sectional side-view of the semiconductor device taken along line Y-Y' (shown in FIG. 1) after a fabrication stage according to embodiments of the invention.

FIG. 7 depicts a cross-sectional side view of the semiconductor device 100 after a next fabrication stage. As shown in FIG. 7, a silicon carbide cap 702 is deposited on top of the sacrificial layer 604. The silicon carbide cap 702 fills the gap between the hardmasks 210.

Figure 8:
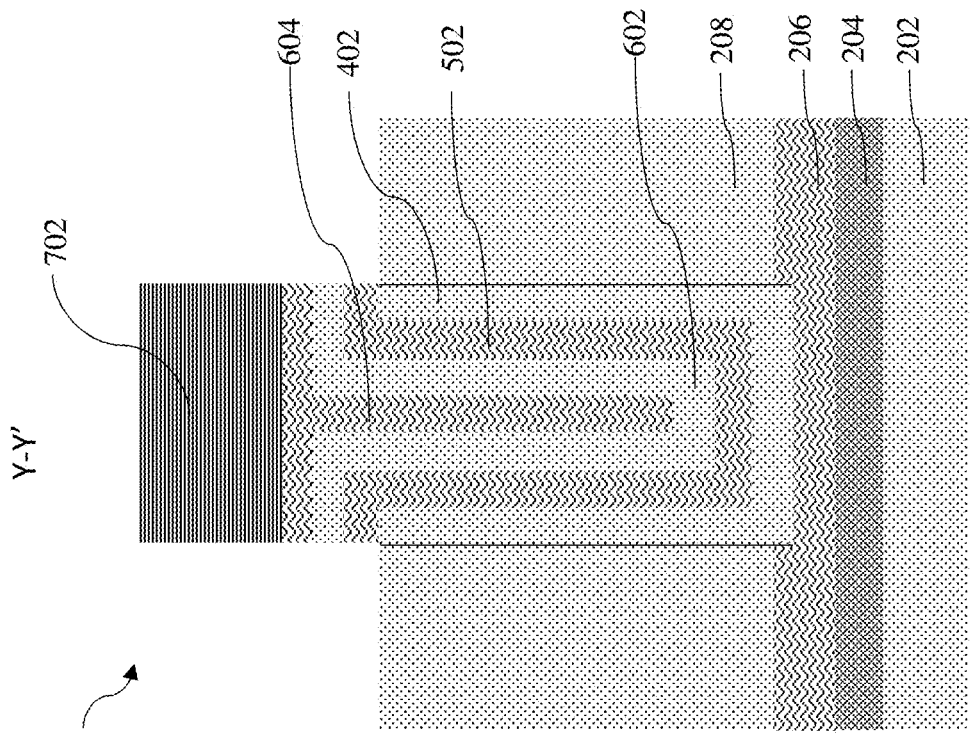
FIG. 8 depicts a cross-sectional side-view of the semiconductor device taken along line Y-Y' (shown in FIG. 1) after a fabrication stage according to embodiments of the invention.

FIG. 8 depicts a cross-sectional side view of the semiconductor device 100 after a next fabrication stage. As shown in FIG. 8, the hard mask 210 is removed and an upper surface of the region 208 is exposed for further processing.

FIG. 9 depicts a cross-sectional side view of the semiconductor device 100 after a next fabrication stage. As shown in FIG. 9, the region 208, which was directly under the hardmask 210, is removed by vertical etching. In embodiments of the invention, the etching can be extended to remove portions of the sacrificial layer 206, the sacrificial bottom isolation layer 204, and the substrate 202 that are directly (vertically) under the hardmask 210. As shown in FIG. 9, the portion of the substrate layer 202 underlying the hardmask 210 is only partially removed, and a thin portion of the substrate layer 202 is maintained. Thus, as shown in FIG. 9, trenches 902 are formed. The trenches 902 extend vertically from the silicon carbide cap 702 to the substrate 202 and abuts the sacrificial layers 204, 206, and the channel layer 402.

FIG. 10 depicts a cross-sectional side view of the semiconductor device 100 after a next fabrication stage. As shown in FIG. 10, the trenches 902 are filled with silicon dioxide to form layers 1002. The top of the device 100 is recessed by chemical mechanical polishing (CMP) to remove the silicon carbide layer 702, the horizontal parts of the layers 502, 602, and 604. As shown in FIG. 10, concentrically stacked U-shaped silicon channel 402 and 602 are formed.

Figure 11:
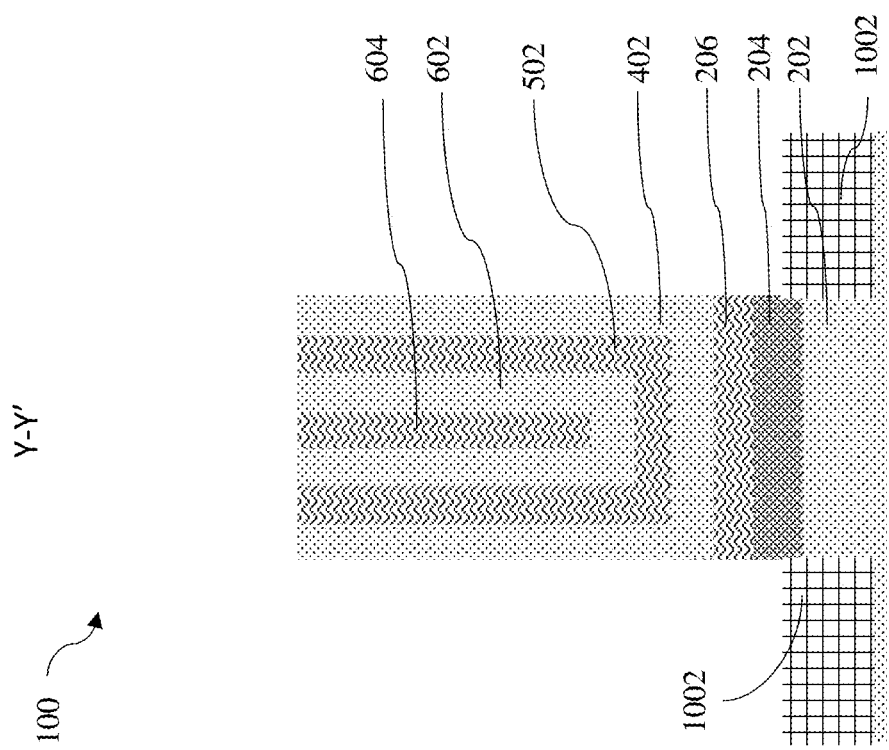
FIG. 11 depicts a cross-sectional side-view of the semiconductor device taken along line Y-Y' (shown in FIG. 1) after a fabrication stage according to embodiments of the invention.

FIG. 11 depicts a cross-sectional side view of the semiconductor device 100 after a next fabrication stage. As shown in FIG. 11, in embodiments of the invention, the silicon dioxide layers 1002 are recessed to reduce the height of the layers 1002. In embodiments of the invention, the silicon dioxide layers 1002 are recessed such that top surface of the layers 1002 is higher than the top surface of substrate layer 202 but lower than the top surface of the bottom sacrificial layer 204.

FIGS. 12A-12B depict cross-sectional side views of the semiconductor device 100 after a next fabrication stage. FIG. 12A depicts a cross-sectional side-view of the semiconductor device taken along line X-X' (shown in FIG. 1) after a fabrication stage according to embodiments of the invention. FIG. 12B depicts a cross-sectional side-view of the semiconductor device taken along line Y-Y' (shown in FIG. 1) after a fabrication stage according to embodiments of the invention.

FIG. 12A depicts a cross-sectional side view of the semiconductor device after the formation of dummy gates 1202A, 1202B, 1202C. The dummy gates 1202A, 1202B, and 1202C can be collectively referred as dummy gates 1202. As shown in FIG. 12B, dummy gates 1202 are formed over the tops of the layers 402, 502, 602, 604, and 1002. The dummy gates 1202 are formed alongside walls of layers 204, 206, and 402. As shown in FIG. 12A and FIG. 12B, hard masks (HM) 1204A, 1204B, 1204C are formed on top of the dummy gates 1202A, 1202B, 1202C, respectively. The hard masks (HM) 1204A, 1204B, 1204C can be collectively referred as hard masks 1204. In one or more embodiments of the invention, the dummy gates 1202A, 1202B, 1202C are formed from amorphous silicon (a-Si), and hard masks 1204A, 1204B, 1204C are formed from silicon nitride (SiN), silicon oxide, an oxide/nitride stack, or similar materials and configurations.

The hard masks 1204A, 1204B, 1204C can be formed by first depositing the hard mask material (for example, silicon nitride) onto the dummy gates 1202A, 1202B, 1202C, for example, by chemical vapor deposition (CVD), plasma enhanced CVD (PECVD) or any suitable technique for dielectric deposition that does not induce a physical or chemical change to the dummy gates 1202A, 1202B, 1202C. The material of the hard mask is patterned into three hard masks 1204A, 1204B, 1204C and this pattern is used to etch into the material of the dummy gates to form dummy gates 1202A, 1202B, 1202C.

Figure 13B:
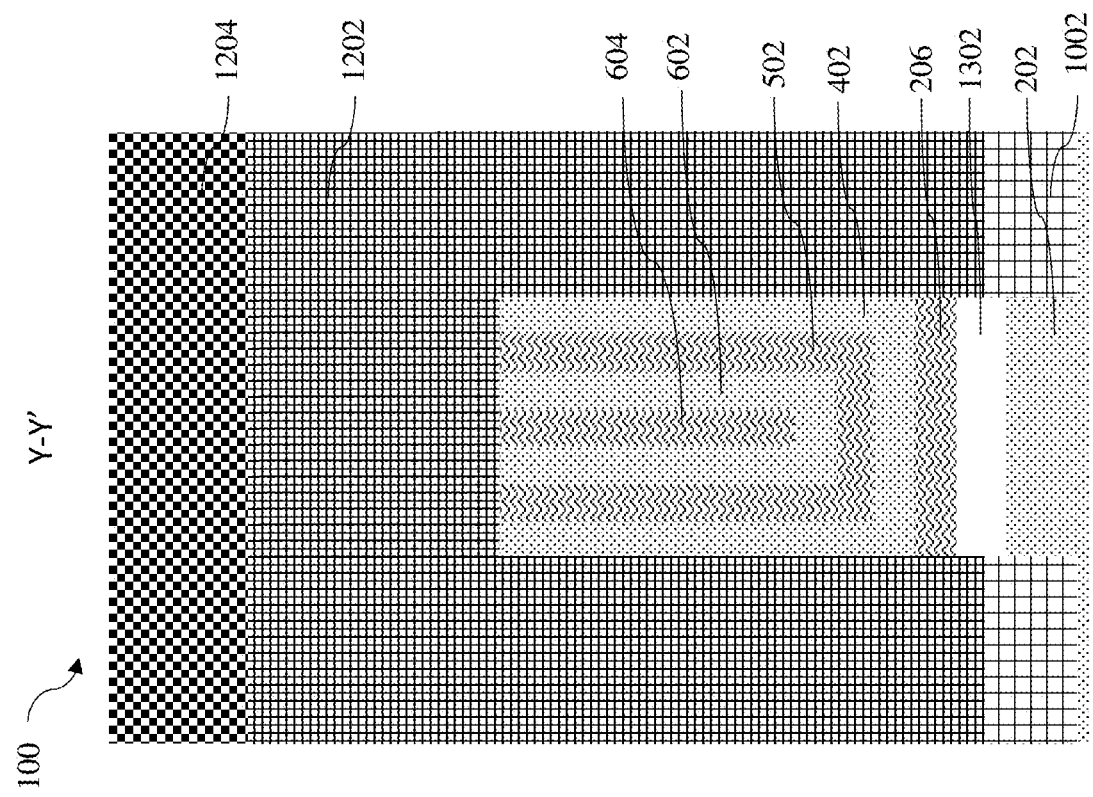
FIG. 13B depicts a cross-sectional side-view of the semiconductor device taken along line Y-Y' (shown in FIG. 1) after a fabrication stage according to embodiments of the invention.
Figure 13A:
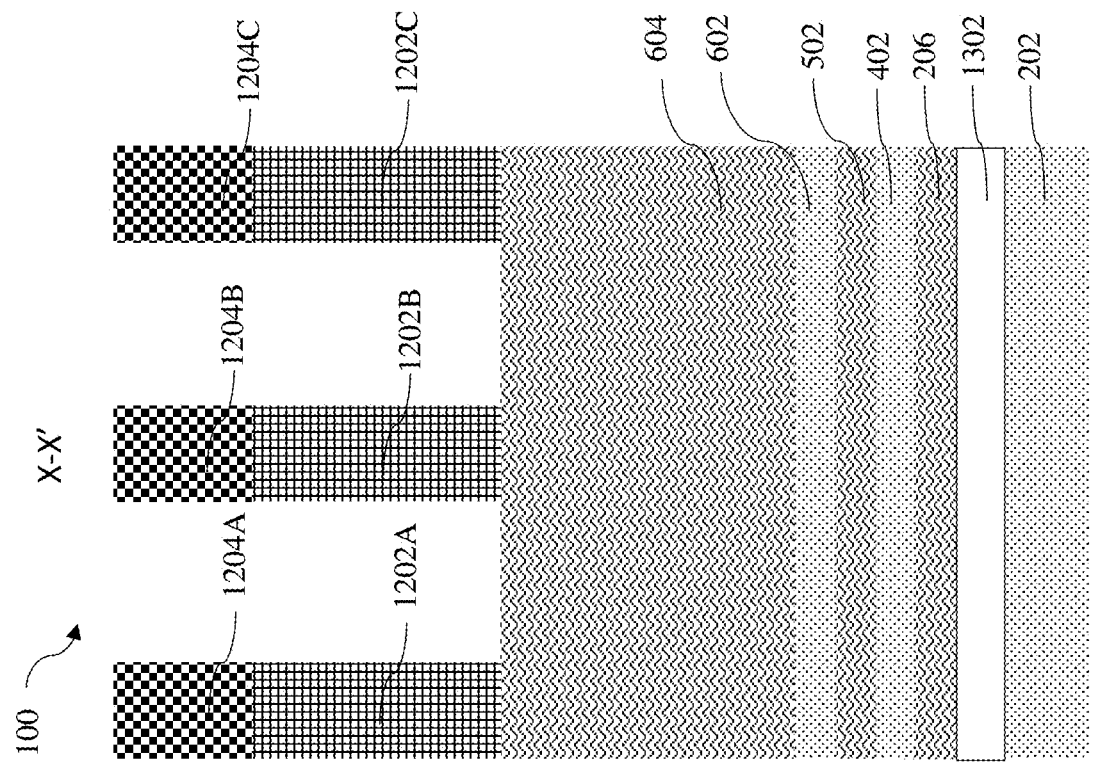
FIG. 13A depicts a cross-sectional side-view of the semiconductor device taken along line X-X' (shown in FIG. 1) after a fabrication stage according to embodiments of the invention.

FIGS. 13A-13B depict cross-sectional side views of the semiconductor device 100 after a next fabrication stage. FIG. 13A depicts a cross-sectional side-view of the semiconductor device taken along line X-X' (shown in FIG. 1) after a fabrication stage according to embodiments of the invention. FIG. 13B depicts a cross-sectional side-view of the semiconductor device taken along line Y-Y' (shown in FIG. 1) after a fabrication stage according to embodiments of the invention.

As shown in FIGS. 13A and 13B, the sacrificial bottom isolation layer 204 is now removed. A selective etch of the sacrificial bottom isolation layer 204 (e.g., $SiGe_{y\ \%}$) is performed which does not remove the other layers, particularly the sacrificial layer 206 (e.g., $SiGe_{x\ \%}$). Although both the sacrificial bottom isolation layer 204 and sacrificial layers 206 can be SiGe, the concentration or atomic percent of Ge is more in the sacrificial bottom isolation layer 204 than in the sacrificial layers 206 such that sacrificial bottom isolation layer 204 is etched without etching the sacrificial layers 206. An example etchant can be HCl or $ClF_3$.

Removal of the sacrificial bottom isolation layer 204 creates opening 1302 underneath the sacrificial layer 206. Although the layers above the opening 1302 appear to be floating (e.g. in FIG. 13A), it noted that the layers are anchored to the dummy gates 1202 as depicted in FIG. 13B. The opening 1302 is created in preparation for a bottom dielectric isolation layer which is to isolate the source and drain regions as discussed herein.

Figure 14B:
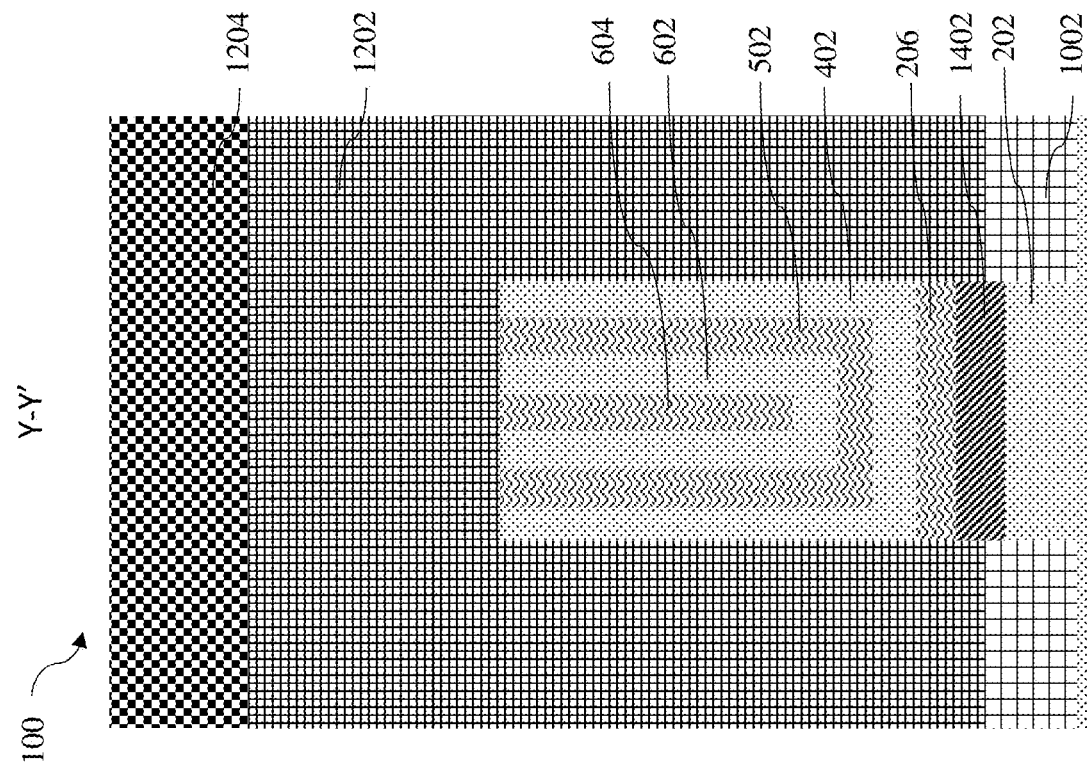
FIG. 14B depicts a cross-sectional side-view of the semiconductor device taken along line Y-Y' (shown in FIG. 1) after a fabrication stage according to embodiments of the invention.
Figure 14A:
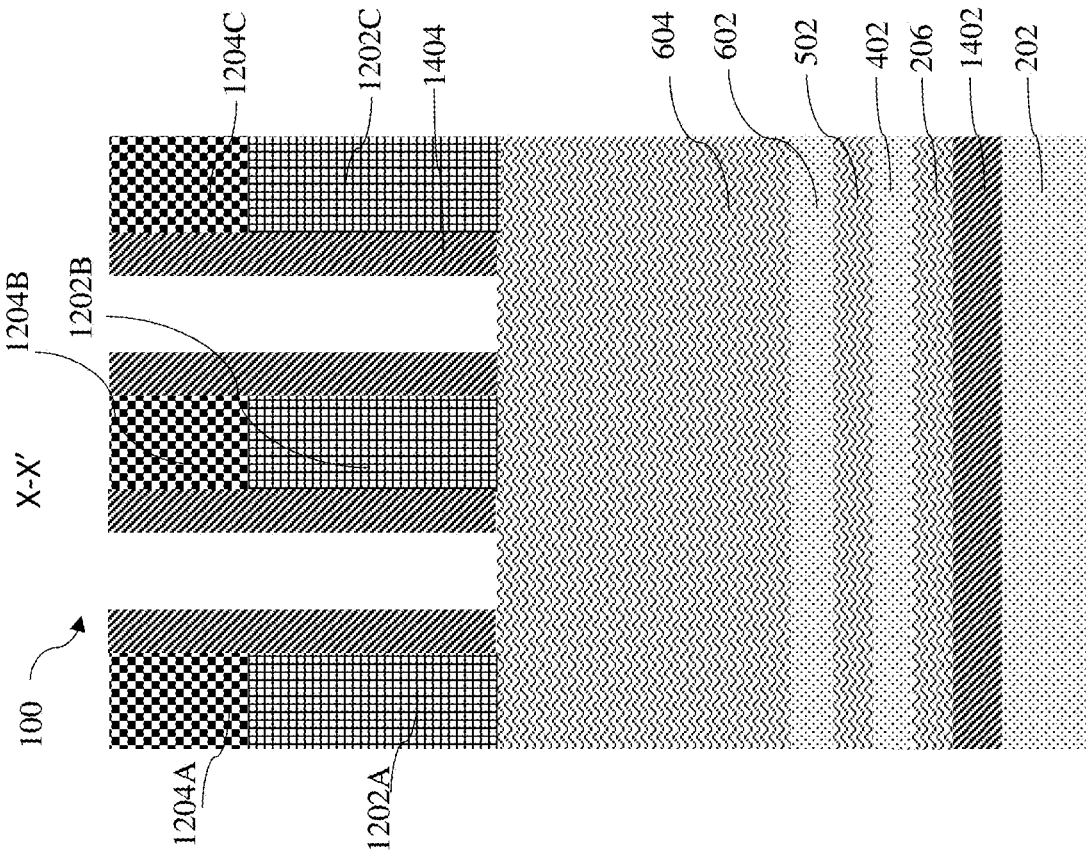
FIG. 14A depicts a cross-sectional side-view of the semiconductor device taken along line X-X' (shown in FIG. 1) after a fabrication stage according to embodiments of the invention.

FIGS. 14A-14B depict cross-sectional side views of the semiconductor device 100 after a next fabrication stage. FIG. 14A depicts a cross-sectional side-view of the semiconductor device taken along line X-X' (shown in FIG. 1) after a fabrication stage according to embodiments of the invention. FIG. 14B depicts a cross-sectional side-view of the semiconductor device taken along line Y-Y' (shown in FIG. 1) after a fabrication stage according to embodiments of the invention.

Conformal deposition of a low-k material is performed which simultaneously forms low-k spacers 1404 on sidewalls of the dummy gates 1202A, 1202B, 1202C, along with a bottom dielectric isolation layer 1402. The bottom dielectric isolation layer 1402 is formed in the previous space 1302 (shown in FIGS. 13A and 13B). The low-k material pinches off in the space/cavity 1302 thereby forming the bottom dielectric isolation layer 1302. The bottom dielectric isolation layer 1302 is a silicon-on-insulator (SOI)-like full isolation without requiring an SOI substrate. The low-k material can be, for example, silicon boron carbide nitride (SiBCN) or silicon oxycarbide (SiOC). Other examples of the low-k material can include SiO, SiOC, SiOCN, etc. In one or more embodiments of the invention, the low-k material is silicon oxycarbide (SiOC). In embodiments of the invention, the bottom dielectric isolation layer 1402 can be the same height as the previous sacrificial bottom isolation layer 204 which was removed to create space 1302.

FIGS. 15A-15B depict cross-sectional side views of the semiconductor device 100 after a next fabrication stage. FIG. 15A depicts a cross-sectional side-view of the semiconductor device taken along line X-X' (shown in FIG. 1) after a fabrication stage according to embodiments of the invention. FIG. 15B depicts a cross-sectional side-view of the semiconductor device taken along line Y-Y' (shown in FIG. 1) after a fabrication stage according to embodiments of the invention.

As shown in FIG. 15A, the low-k spacers 1404 are in effect used as masks, and portions of the silicon germanium sacrificial layers 206, 502, 604, and the channel layer 402, 602, that are not under the low-k spacers 1404 and the dummy gates 1202A, 1202B, 1202C are fin-etched through to form trenches 1502A, 1502B in the source/drain regions. In one or more embodiments of the invention, silicon reactive-ion etching (ME) is used to perform a fin etch through the alternating series of the sacrificial silicon germanium layers (206, 502, 604) and the channel layers (402, 602). The fin etch forms the trenches 1502A and 1502B.

As described in greater detail herein below, portions of the channel layers 402, 602, once released from the sacrificial layers 206, 502, 604, will form the channels of the semiconductor device. Because the fin etch is being performed before the dummy gate/replacement gate steps (described in greater detail later herein), the semiconductor device fabrication processes described herein can be referred to as a fin first process. Additionally, because the channels 402, 602 will be released from the sacrificial layers 206, 502, 604 after the dummy gate/replacement gate steps, the semiconductor device fabrication process described herein can also be referred to as a wire/sheet last process.

Figures 16A, 16B:
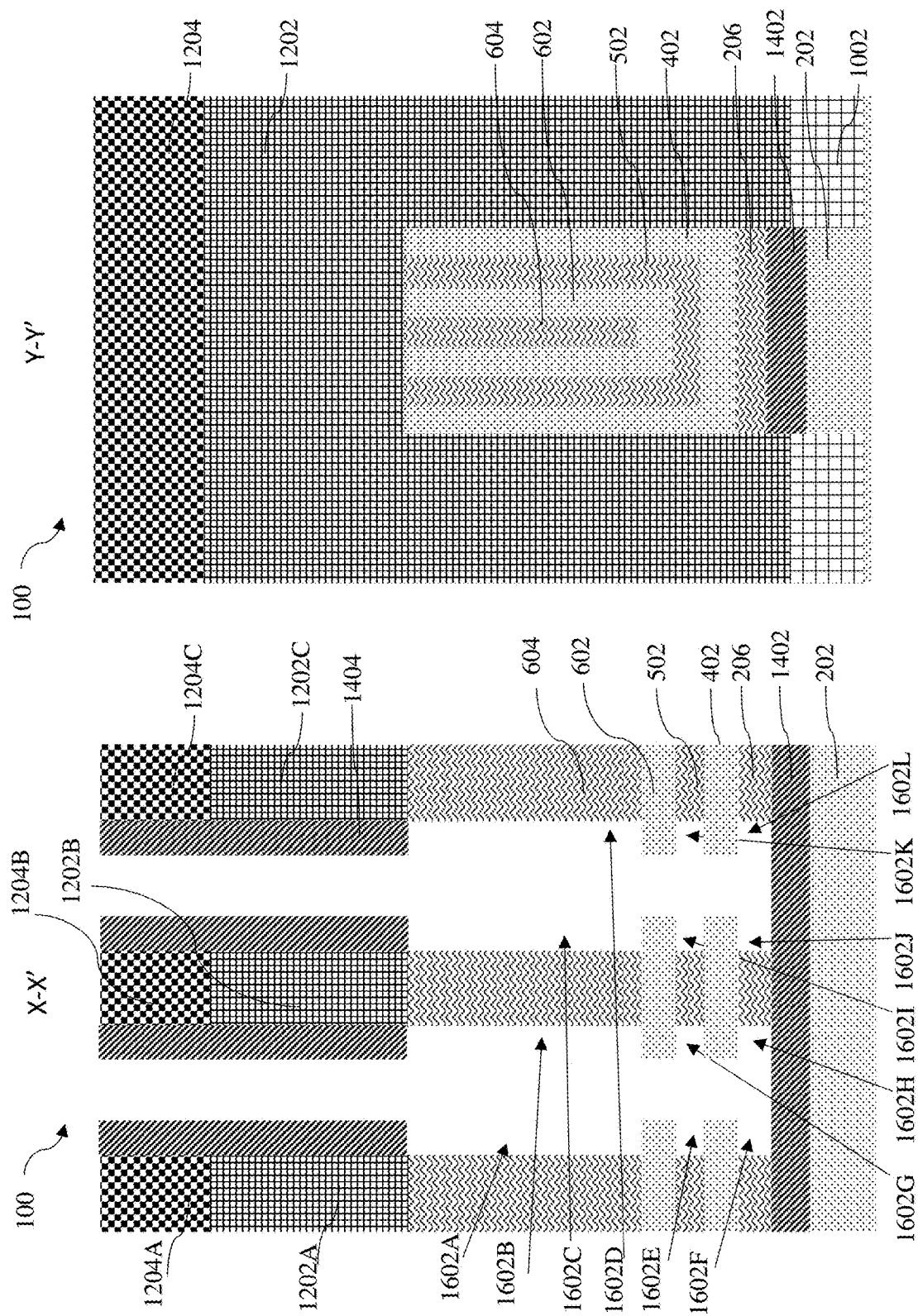
FIG. 16A depicts a cross-sectional side-view of the semiconductor device taken along line X-X' (shown in FIG. 1) after a fabrication stage according to embodiments of the invention.
FIG. 16B depicts a cross-sectional side-view of the semiconductor device taken along line Y-Y' (shown in FIG. 1) after a fabrication stage according to embodiments of the invention.

FIGS. 16A-16B depict cross-sectional side views of the semiconductor device 100 after a next fabrication stage. FIG. 16A depicts a cross-sectional side-view of the semiconductor device taken along line X-X' (shown in FIG. 1) after a fabrication stage according to embodiments of the invention. FIG. 16B depicts a cross-sectional side-view of the semiconductor device taken along line Y-Y' (shown in FIG. 1) after a fabrication stage according to embodiments of the invention.

As shown in FIG. 16A, the sacrificial layers 206, 502, 604 are pulled back from underneath the low-k spacer material 1404 and the channel layers 402, 406 using, for example, a hydrogen chloride (HCL) gas isotropic etch process, which etches silicon germanium without attacking silicon. Cavities 1602A, 1602B, 1602C, 1602D, 1602E, 1602F, 1602G, 1602H, 1602I, 1602J, 1602K, 1602L (collectively, cavities 1602) are formed by spaces that were occupied by the removed portions of the sacrificial layers 206, 502, 604.

Figure 17B:
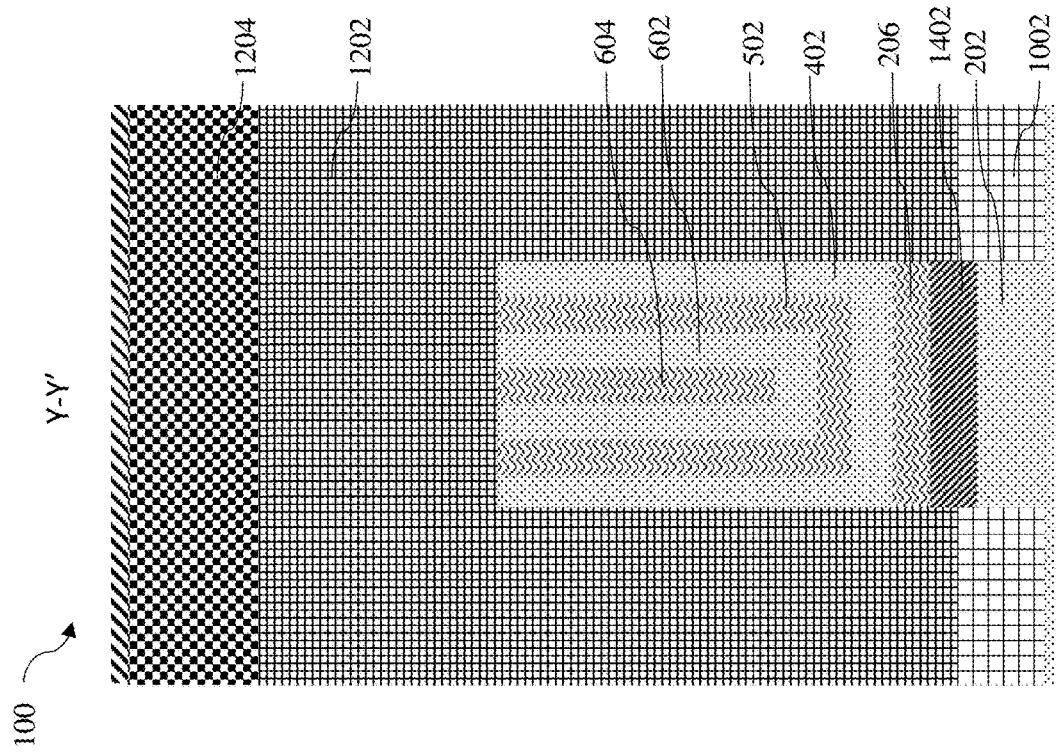
FIG. 17B depicts a cross-sectional side-view of the semiconductor device taken along line Y-Y' (shown in FIG. 1) after a fabrication stage according to embodiments of the invention.
Figure 17A:
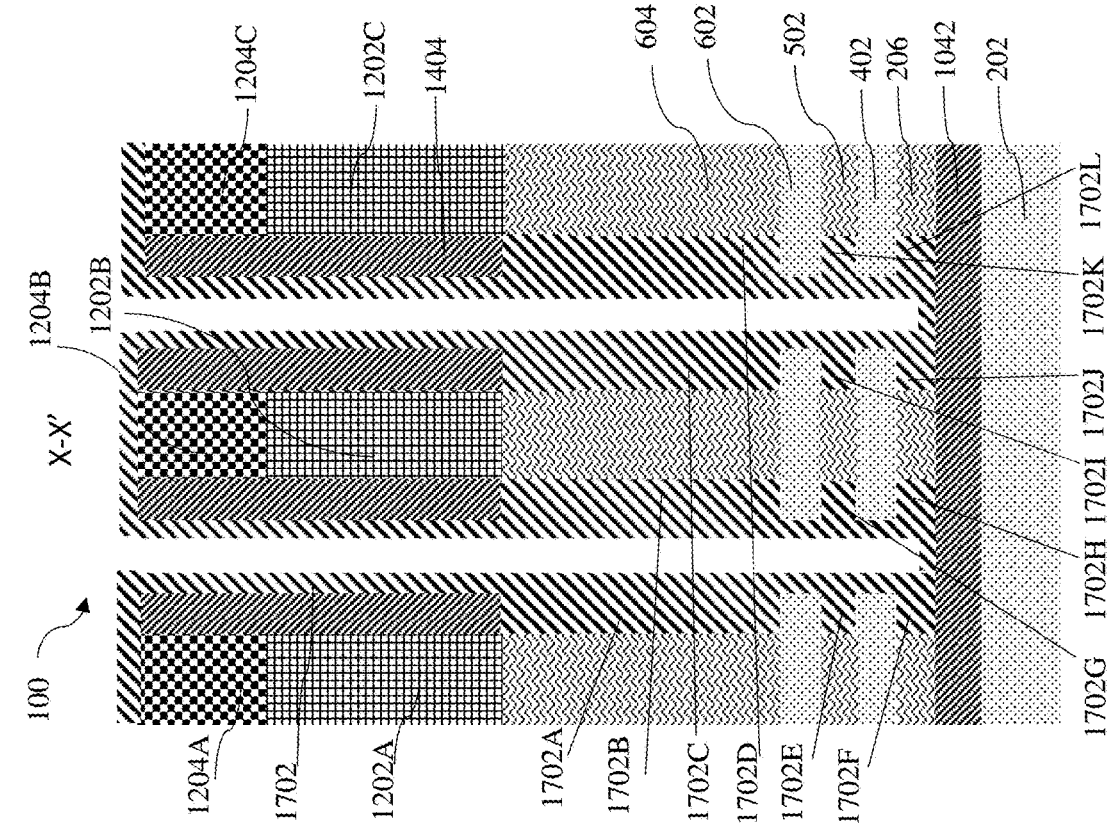
FIG. 17A depicts a cross-sectional side-view of the semiconductor device taken along line X-X' (shown in FIG. 1) after a fabrication stage according to embodiments of the invention.

FIGS. 17A-17B depict cross-sectional side views of the semiconductor device 100 after a next fabrication stage. FIG. 17A depicts a cross-sectional side-view of the semiconductor device 100 taken along line X-X' (shown in FIG. 1) after a fabrication stage according to embodiments of the invention. FIG. 17B depicts a cross-sectional side-view of the semiconductor device 100 taken along line Y-Y' (shown in FIG. 1) after a fabrication stage according to embodiments of the invention.

A layer of spacer material 1702 is conformally deposited over the semiconductor structure 100. Specifically, portions of the layer of semiconductor material 1702 fills in the cavities 1602 (shown in FIG. 16A) to form inner spacers 1702A, 1702B, 1702C, 1702D, 1702E, 1702F, 1702G 1702H, 1702I, 1702J, 1702K, 1702L (collectively, inner spacers 1702). In one or more embodiments of the invention, the low-k spacers 1404 and the inner spacers 1702 can be made from different materials. In one or more embodiments, the low-k spacers 1404 and the inner spacers 1702 are made of the same material. The dielectric material for spacers 1404 and 1702 is independently selected from silicon nitride, silicon borocarbonitride (SiBCN), silicon oxycarbonitride (SiOCN), and similar materials.

Figures 18A, 18B:
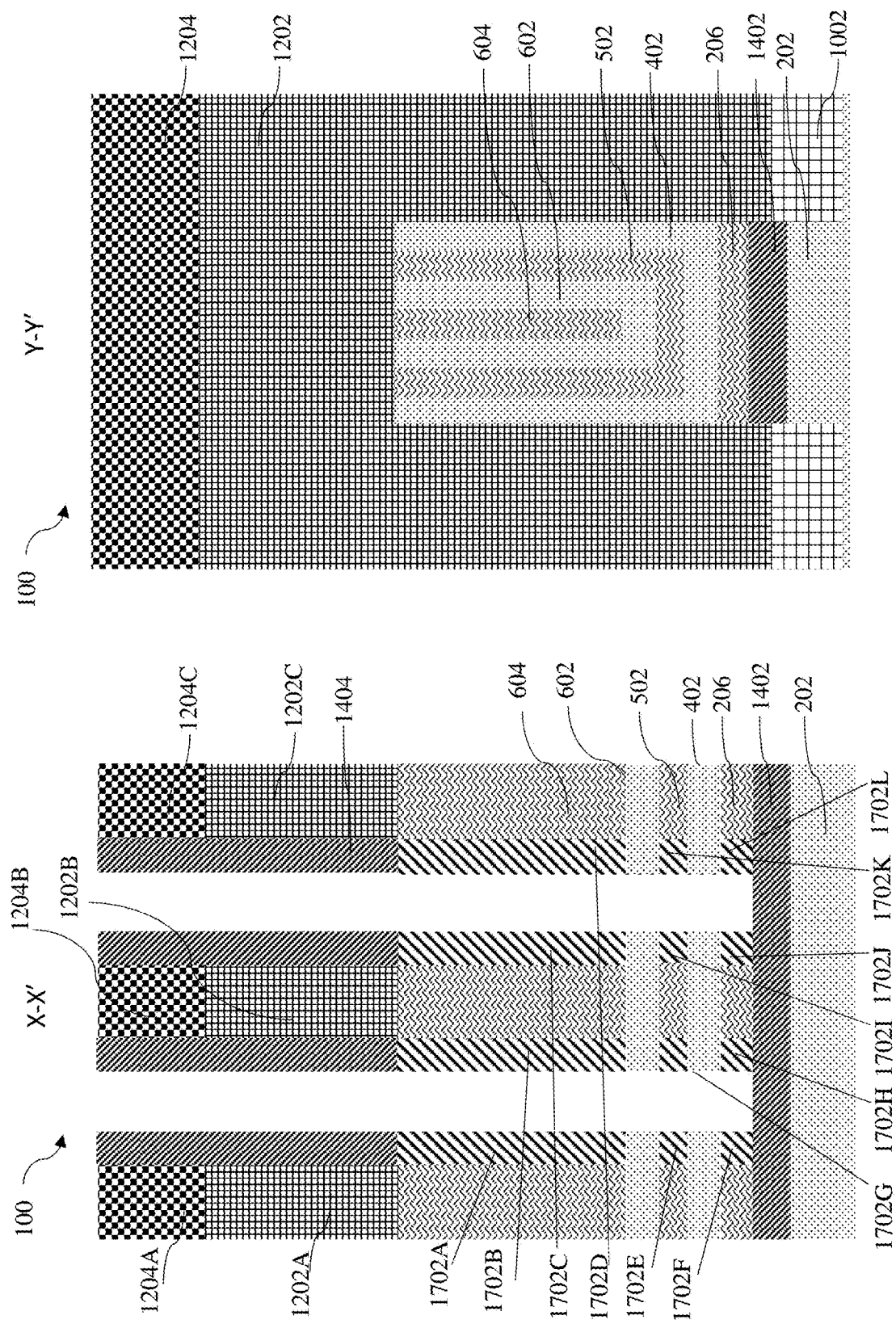
FIG. 18A depicts a cross-sectional side-view of the semiconductor device taken along line X-X' (shown in FIG. 1) after a fabrication stage according to embodiments of the invention.
FIG. 18B depicts a cross-sectional side-view of the semiconductor device taken along line Y-Y' (shown in FIG. 1) after a fabrication stage according to embodiments of the invention.

FIGS. 18A-18B depict cross-sectional side views of the semiconductor device 100 after a next fabrication stage. FIG. 18A depicts a cross-sectional side-view of the semiconductor device 100 taken along line X-X' (shown in FIG. 1) after a fabrication stage according to embodiments of the invention. FIG. 18B depicts a cross-sectional side-view of the semiconductor device 100 taken along line Y-Y' (shown in FIG. 1) after a fabrication stage according to embodiments of the invention.

As shown in FIG. 18A, using the low-k spacers 1404 as masks, an isotropic etch, such as wet chemical etch, is used to remove the layers of inner spacer material 1702 that are not under the low-k spacers 1404, while retaining the inner spacer materials 1702A, 1702B, 1702C, 1702D, 1702E, 1702F, 1702G 1702H, 1702I.

Figures 19A, 19B:
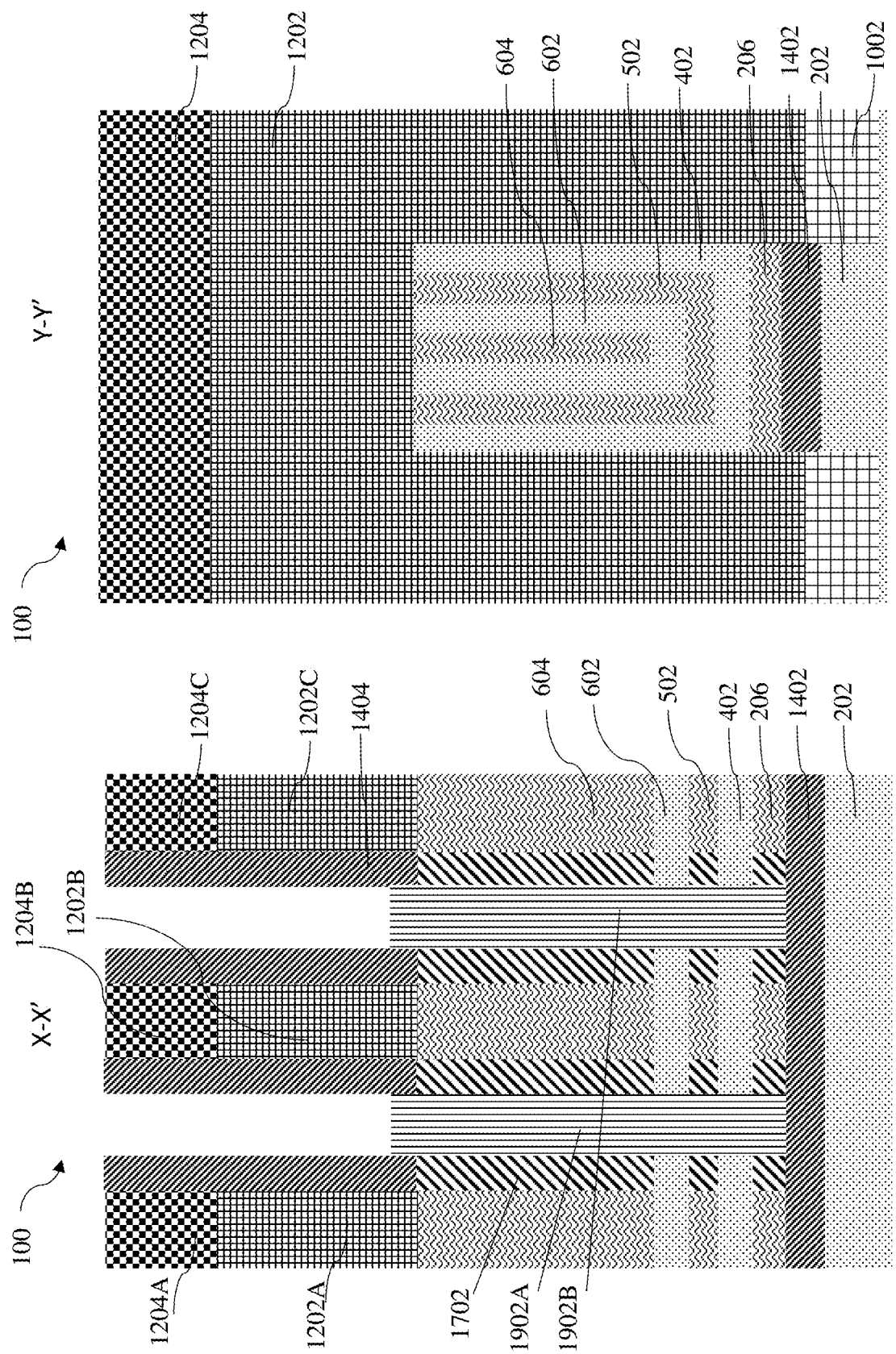
FIG. 19A depicts a cross-sectional side-view of the semiconductor device taken along line X-X' (shown in FIG. 1) after a fabrication stage according to embodiments of the invention.
FIG. 19B depicts a cross-sectional side-view of the semiconductor device taken along line Y-Y' (shown in FIG. 1) after a fabrication stage according to embodiments of the invention.

FIGS. 19A-19B depict cross-sectional side views of the semiconductor device 100 after a next fabrication stage. FIG. 19A depicts a cross-sectional side-view of the semiconductor device taken along line X-X' (shown in FIG. 1) after a fabrication stage according to embodiments of the invention. FIG. 19B depicts a cross-sectional side-view of the semiconductor device taken along line Y-Y' (shown in FIG. 1) after a fabrication stage according to embodiments of the invention.

As shown in FIG. 19A, source/drain regions 1902A and 1902B are formed using an epitaxial layer growth process on the ends of exposed silicon channels 402 and 602. In-situ doping (ISD) is applied to form doped source/drain regions 1902A, 1902B, thereby creating the necessary junctions of the semiconductor device 100. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction (s). N-type devices can be formed by implanting arsenic (As) or phosphorous (P), and p-type devices can be formed by implanting boron (B).

FIGS. 20A-20B depict cross-sectional side views of the semiconductor device 100 after a next fabrication stage. FIG. 20A depicts a cross-sectional side-view of the semiconductor device 100 taken along line X-X' (shown in FIG. 1) after a fabrication stage according to embodiments of the invention. FIG. 20B depicts a cross-sectional side-view of the semiconductor device 100 taken along line Y-Y' (shown in FIG. 1) after a fabrication stage according to embodiments of the invention.

As shown in FIG. 20A, an inter-level dielectric (ILD) material 2002 (shown as ILD material 2002A and 2002B) is deposited to cap the source/drain regions 1902A, 1902B. The ILD material 2002 is a low-k dielectric material such as, for example, an oxide material like silicon dioxide. The hardmasks 1202A, 1202B, 1202C are removed, and the ILD material 2002 is recessed by chemical mechanical polishing (CMP) until tops of the dummy gates 1202A, 1202B, 1202C are reached.

FIGS. 21A-21B depict cross-sectional side views of the semiconductor device 100 after a next fabrication stage. FIG. 21A depicts a cross-sectional side-view of the semiconductor device 100 taken along line X-X' (shown in FIG. 1) after a fabrication stage according to embodiments of the invention. FIG. 21B depicts a cross-sectional side-view of the semiconductor device 100 taken along line Y-Y' (shown in FIG. 1) after a fabrication stage according to embodiments of the invention.

As shown in FIG. 21A and FIG. 21B, a poly pull process is performed to remove the dummy gates 1202A, 1202B, 1202C. Further, the sacrificial layers 206, 502, 604 are removed by etching to release the channel layers 402 and 602. An example etchant can be HCl or $ClF_3$.

Figures 22A, 22B:
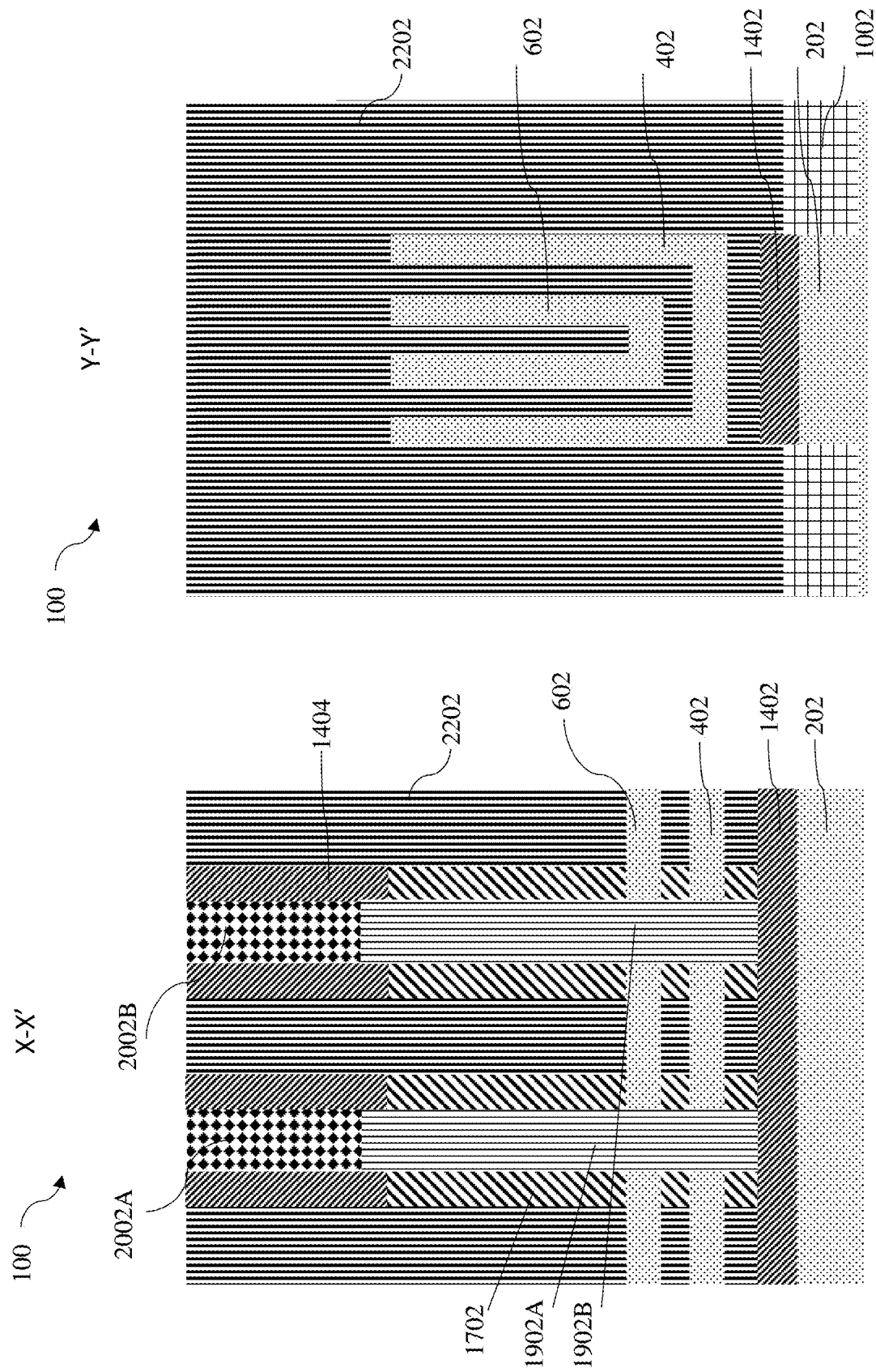
FIG. 22A depicts a cross-sectional side-view of the semiconductor device taken along line X-X' (shown in FIG. 1) after a fabrication stage according to embodiments of the invention.
FIG. 22B depicts a cross-sectional side-view of the semiconductor device taken along line Y-Y' (shown in FIG. 1) after a fabrication stage according to embodiments of the invention.

FIGS. 22A-22B depict cross-sectional side views of the semiconductor device 100 after a next fabrication stage. FIG. 22A depicts a cross-sectional side-view of the semiconductor device 100 taken along line X-X' (shown in FIG. 1) after a fabrication stage according to embodiments of the invention. FIG. 22B depicts a cross-sectional side-view of the semiconductor device 100 taken along line Y-Y' (shown in FIG. 1) after a fabrication stage according to embodiments of the invention.

As shown in FIG. 22A, in a gate-late fabrication process, the removed dummy gate structures 1202A, 1202B, 1202C have been replaced with replacement metal gate structures 2202 using gate replacement techniques that are known in the art. The dummy gates 1202A, 1202B, 1202C can be removed by an etching process, e.g., RIE or COR, to form a trench. A dielectric material and one or more gate metals can be deposited in the space previously occupied by the dummy gates 1202A, 1202B, 1202C. For example, high-K (HK) dielectric material, e.g., hafnium based material, can be used to form a gate dielectric (the gate dielectric material is not shown in the Figures in order to avoid overcrowding of the Figures). A metal liner, e.g., a work-function metal, and a gate metal can be deposited on the gate dielectric material to complete the gate formation. In one or more embodiments of the invention, the metal liner can be, for example, TiN, TiAlN, TiAlC, TiC, or TaN, and the gate metal can be aluminum or tungsten.

In embodiments of the invention, the replacement metal gate structures 2202 can be high-k metal gates (HKMG). Techniques for forming HKMG structures are well-known in the art and, thus, the details have been omitted in order to allow the reader to focus on the salient aspects of the discussed herein. However, it should be understood that such HKMG will generally include formation of one or more gate dielectric layers (e.g., an inter-layer (IL) oxide and a high-k gate dielectric layer), which are deposited/formed so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. For explanation purposes, a high-K gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

Figures 23A, 23B:
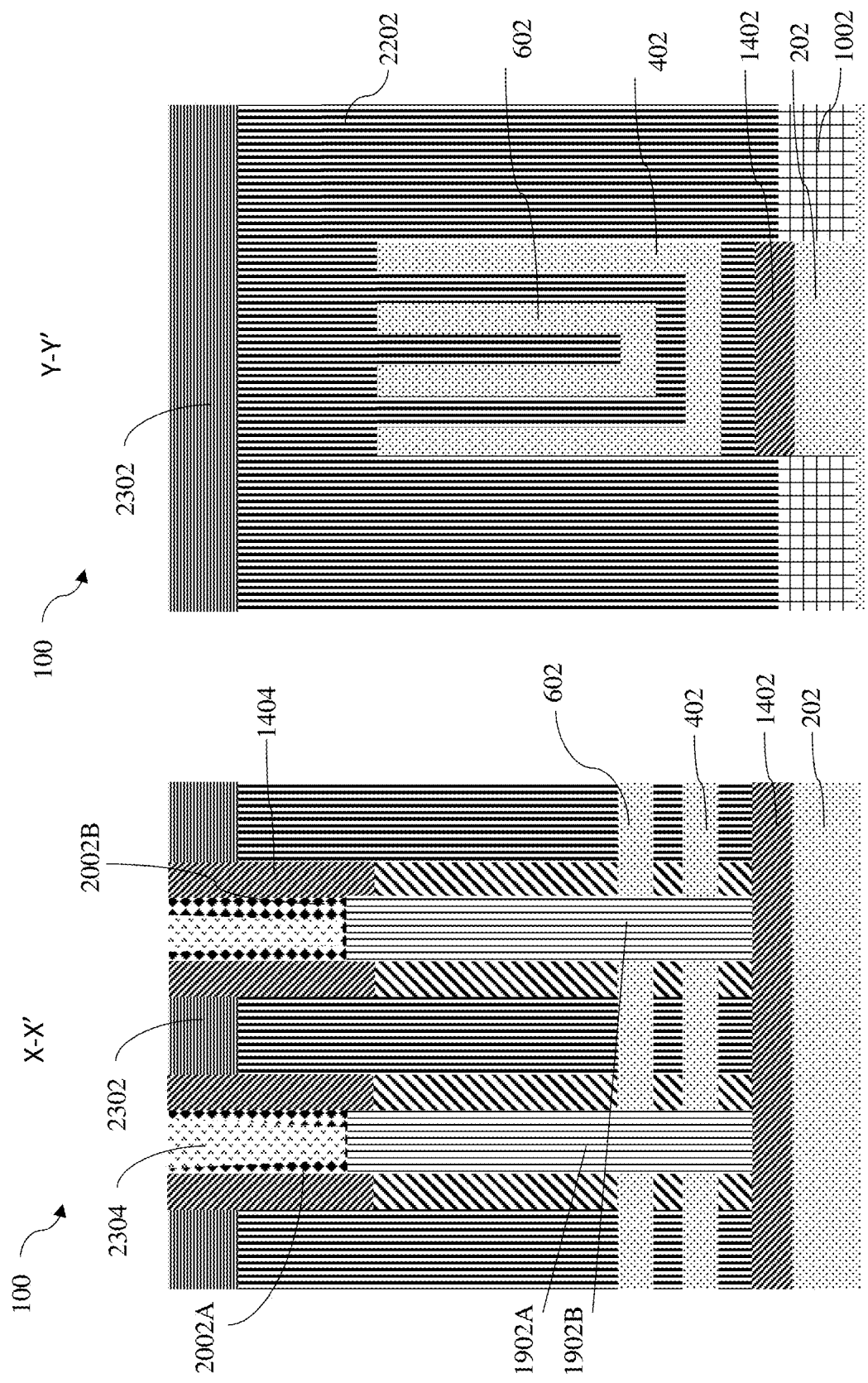
FIG. 23A depicts a cross-sectional side-view of the semiconductor device taken along line X-X' (shown in FIG. 1) after a fabrication stage according to embodiments of the invention.
FIG. 23B depicts a cross-sectional side-view of the semiconductor device taken along line Y-Y' (shown in FIG. 1) after a fabrication stage according to embodiments of the invention.

FIGS. 23A-23B depict cross-sectional side views of the semiconductor device 100 after a next fabrication stage. FIG. 23A depicts a cross-sectional side-view of the semiconductor device 100 taken along line X-X' (shown in FIG. 1) after a fabrication stage according to embodiments of the invention. FIG. 23B depicts a cross-sectional side-view of the semiconductor device 100 taken along line Y-Y' (shown in FIG. 1) after a fabrication stage according to embodiments of the invention.

As shown in FIGS. 23A and 23B, a self-aligned contact (SAC) cap 2302 is formed on top of the replacement metal gate 2202. The SAC cap 2302 is an insulating material, such as, silicon nitride, silicon borocarbonitride (SiBCN), silicon oxycarbonitride (SiOCN), silicon carbide (SiC) and etc. Further, trench contact formation is performed in the ILD material 2002 over the source and drain epitaxy 1902, and the source and drain contacts 2304 are formed. The source and drain contacts 2304 can be referred to as trench silicide (TS) contacts. The material of the source and drain contacts 2304 can include one or more layers. The source and drain contacts 2304 can be a Ti/TiN stack in which the titanium (Ti) is deposited first and titanium nitride (TiN) second. Other materials of the source and drain contacts 2304 can be tungsten (W) for instance. The device 100 shown in FIGS. 23A and 23B is an illustrative example showing a two-channel structure. In an actual semi-conductor circuit, the illustrated device 100 may be part of a single transistor or shared-part of multiple transistors based on the requirements of the actual circuit. The device 100 illustrated in FIGS. 23A and 23B is not a limiting structure, instead, it is an illustration of one or more embodiments of the present invention.

It should be appreciated that various modifications can be made to the above described method to form nanosheet FET and/or FinFET, according to embodiments of the invention. For example, as shown in FIG. 24, in one or more embodiments of the invention, the semiconductor device includes, in addition to the concentrically stacked U-shaped channel layers, one or more rectangular sheet like channel layers. In one or more embodiments of the invention, the one or more rectangular sheet like channel layers can be located in the cavity defined by the U-shaped channel layer. An exemplary structure of such device is illustrated in FIG. 24. As shown in FIG. 24, the exemplary device 100 includes U-shaped channel layers 402 and 602, and a plate/sheet like channel layer 2402.

FIG. 25 depicts a flow diagram illustrating a methodology 2500 according to one or more embodiments of the present invention. At block 2502, an epitaxial stack of sacrificial layers 204, 206, and 208 is formed. At block 2504, a trench 302 is patterned into the epitaxial stack of sacrificial layers 204, 206, and 208. At block 2506, a first U-shaped channel layer 402 is formed in the trench 302. At block 2508, a sacrificial layer 502 conformally covering the first U-shaped channel layer 402 is formed in the trench 302. At block 2510, a second U-shaped channel layer 602 is formed in the trench 302. The second U-shaped channel layer 602 conformally covers the sacrificial layer 502. At block 2512, another sacrificial layer 604 is formed covering the second U-shaped channel layer 602. At block 2514, shallow trench isolation 1002 is formed, filled with STI oxide, and recessed to appropriate height. At block 2516, dummy gates 1202 are formed over side walls of first channel layer 402, sacrificial layers 204, 206, and top walls of channel layers 402, 602, and sacrificial layers 502, 604. At block 2516, a bottom isolation layer 1402 and spacers 1404 are also formed. Also at block 2516, inner spacers 1702 are formed. Block 2518 grows source/drain regions 1902 by epitaxy. Growing the source/drain regions 1902 can include in-situ doping to form the necessary junctions for either n-type or p-type nanosheet FET devices, including, optionally, extension junctions in the nanosheets at the interface between the nanosheets and the source/drain regions. Block 2518 also deposits inter-level dielectric (ILD) 2002 and performs chemical mechanical planarization. Block 2520 removes the dummy gates 1202 and forms replacement metal gate (RMG) 2202. Block 2522 forms self-aligned contact (SAC) cap 2302 and TS contacts 2304.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming a stack of sacrificial layers on a substrate;
    forming a U-shaped trench in the stack of the sacrificial layers;
    depositing a first U-shaped channel layer in the U-shaped trench, the first U-shaped channel layer comprising a semiconductor material;
    forming a first U-shaped sacrificial layer conformally covering the U-shaped channel layer;
    depositing a second U-shaped channel layer conformally covering the first U-shaped sacrificial layer, the second U-shaped channel layer comprising a semiconductor material; and
    forming a gate around the first and the second U-shaped channel layers;
    wherein the first U-shaped channel layer and the second U-shaped channel layer define concentrically stacked U-shaped nanosheets.

2. The method of claim 1, wherein the stack of sacrificial layers comprises at least a first substantially planar sacrificial layer and a second substantially planar sacrificial layer.

3. The method of claim 2, wherein materials of the first substantially planar sacrificial layer and the second substantially planar sacrificial layer are structured to be selectively etched.

4. The method of claim 3, wherein the first substantially planar sacrificial layer comprises $SiGe_{60\%}$ and the second substantially planar sacrificial layer comprises $SiGe_{25\%}$.

5. The method of claim 3 further comprising:
    removing an end portion of at least one substantially planar sacrificial layer to form a cavity; and
    depositing an inner spacer material in the cavity.

6. The method of claim 1, wherein:
    the gate comprises a sacrificial dummy gate; and
    the method further comprises
        forming the sacrificial dummy gate on the second U-shaped channel layer; and
        replacing the sacrificial dummy gate with a conductive replacement gate material to thereby form the gate.

7. The method of claim 6 further comprising forming an offset spacer positioned along a sidewall of the sacrificial dummy gate before replacing the sacrificial dummy gate with the conductive replacement gate material.

8. The method of claim 1, wherein the stack of sacrificial layers comprises a bottom sacrificial layer and a top sacrificial layer, the method further comprising
    removing the bottom sacrificial layer from under the top sacrificial layer so as to leave an opening; and
    forming a bottom isolation layer in the opening.

9. The method of claim 8, wherein the material of the bottom sacrificial layer comprises a higher atomic percent of an etchable element than the top sacrificial layer.

10. The method of claim 8, wherein the bottom sacrificial layer comprises a higher atomic percent of germanium than the top sacrificial layer.

11. The method of claim 8, wherein the top sacrificial layer comprises $SiGe_{60\%}$.

12. The method of claim 8, wherein the bottom sacrificial layer comprises $SiGe_{25\%}$.

13. The method of claim 1 further comprising forming a shallow trench isolation (STI) region in the substrate.

* * * * *